(12) United States Patent
Yang et al.

(10) Patent No.: US 11,152,251 B2
(45) Date of Patent: Oct. 19, 2021

(54) METHOD FOR MANUFACTURING SEMICONDUCTOR DEVICE HAVING VIA FORMED BY ION BEAM

(71) Applicants: TAIWAN SEMICONDUCTOR MANUFACTURING CO., LTD., Hsinchu (TW); National Taiwan University, Taipei (TW)

(72) Inventors: Che-Wei Yang, New Taipei (TW); Hao-Hsiung Lin, Taipei (TW)

(73) Assignees: TAIWAN SEMICONDUCTOR MANUFACTURING CO., LTD., Hsinchu (TW); NATIONAL TAIWAN UNIVERSITY, Taipei (TW)

( * ) Notice: Subject to any disclaimer, the term of this patent is extended or adjusted under 35 U.S.C. 154(b) by 0 days.

(21) Appl. No.: 15/965,076

(22) Filed: Apr. 27, 2018

(65) Prior Publication Data
US 2019/0035676 A1    Jan. 31, 2019

Related U.S. Application Data

(60) Provisional application No. 62/539,440, filed on Jul. 31, 2017.

(51) Int. Cl.
*H01L 21/76* (2006.01)
*H01L 21/768* (2006.01)
(Continued)

(52) U.S. Cl.
CPC ...... *H01L 21/76802* (2013.01); *H01L 21/263* (2013.01); *H01L 21/31116* (2013.01);
(Continued)

(58) Field of Classification Search
CPC ......... H01L 21/76802; H01L 21/31116; H01L 21/76224; H01L 21/263; H01L 29/66477;
(Continued)

(56) References Cited

U.S. PATENT DOCUMENTS 4,900,695 A * 2/1990 Takahashi ............. H01L 21/768
250/492.2
4,962,059 A * 10/1990 Nishioka ........... H01L 21/76877
257/E21.585

(Continued)

FOREIGN PATENT DOCUMENTS

JP          09246232 A  *  9/1997

*Primary Examiner* — Mohammad M Hoque
(74) *Attorney, Agent, or Firm* — McDermott Will & Emery LLP

(57) ABSTRACT

A method for manufacturing a semiconductor device includes forming a source region, a drain region, and a gate dielectric layer and a gate electrode covering a channel region between the source region and the drain region, forming an insulating layer over the source region, the drain region, and the gate electrode, forming first to third vias penetrating the insulating layer and exposing portions of the source region, the drain region, and the gate electrode, respectively, forming a source contact in the first via to electrically connect to the source region, forming a drain contact in the second via to electrically connect to the drain region, and forming a gate contact in the third via to electrically connect to the gate electrode. One or more of the first to third vias is formed by ion bombarding by a focused ion beam and followed by a thermal annealing process.

20 Claims, 22 Drawing Sheets

(51) Int. Cl.
*H01L 21/48* (2006.01)
*H01L 21/56* (2006.01)
*H01L 21/324* (2006.01)
*H01L 21/762* (2006.01)
*H01L 29/66* (2006.01)
*H01L 21/263* (2006.01)
*H01L 21/311* (2006.01)
*H01L 23/31* (2006.01)
*H01L 21/8238* (2006.01)
*H01L 23/485* (2006.01)

(52) U.S. Cl.
CPC .......... *H01L 21/324* (2013.01); *H01L 21/486* (2013.01); *H01L 21/4853* (2013.01); *H01L 21/4857* (2013.01); *H01L 21/56* (2013.01); *H01L 21/76224* (2013.01); *H01L 21/76816* (2013.01); *H01L 21/76895* (2013.01); *H01L 21/76898* (2013.01); *H01L 29/66477* (2013.01); *H01L 21/823871* (2013.01); *H01L 21/823878* (2013.01); *H01L 23/3128* (2013.01); *H01L 23/485* (2013.01)

(58) Field of Classification Search
CPC .......... H01L 21/4853; H01L 21/76895; H01L 21/324; H01L 21/56; H01L 21/486; H01L 21/4857; H01L 21/823871; H01L 21/823878; H01L 23/3128
USPC ........................................................ 438/126
See application file for complete search history.

(56) References Cited

U.S. PATENT DOCUMENTS

| | | | | |
|---|---|---|---|---|
| 5,086,015 | A * | 2/1992 | Itoh | H01L 21/76802 148/DIG. 46 |
| 5,139,968 | A * | 8/1992 | Hayase | H01L 21/28587 148/DIG. 140 |
| 5,580,419 | A * | 12/1996 | Berenz | H01L 21/67167 257/E21.452 |
| 6,197,697 | B1 * | 3/2001 | Simpson | H01L 21/3043 216/62 |
| 6,300,171 | B1 * | 10/2001 | Frisina | H01L 29/0619 438/140 |
| 6,420,075 | B1 * | 7/2002 | Okamoto | G03F 1/29 430/22 |
| 7,927,980 | B2 * | 4/2011 | Tauzin | H01L 21/02532 438/480 |
| 8,426,961 | B2 | 4/2013 | Shih et al. | |
| 9,972,682 | B2 * | 5/2018 | Gluschenkov | H01L 29/0847 |
| 2004/0169253 | A1 * | 9/2004 | Springer | H01L 21/76216 257/519 |
| 2005/0224995 | A1 * | 10/2005 | Lee | H01L 22/24 438/689 |
| 2007/0238233 | A1 * | 10/2007 | Sadaka | H01L 21/823807 438/187 |
| 2008/0064182 | A1 * | 3/2008 | Hebras | H01L 21/76254 438/455 |
| 2012/0286335 | A1 * | 11/2012 | Zhang | H01L 21/76805 257/288 |
| 2016/0056242 | A1 * | 2/2016 | Masuda | H01L 29/1095 257/77 |
| 2016/0190133 | A1 * | 6/2016 | Wu | H01L 27/0922 257/369 |
| 2017/0077244 | A1 * | 3/2017 | Chang | H01L 29/36 |
| 2017/0077305 | A1 * | 3/2017 | Chang | H01L 29/7848 |
| 2017/0278930 | A1 * | 9/2017 | Ruhl | H01L 21/76251 |
| 2018/0033889 | A1 | 2/2018 | Yang et al. | |

* cited by examiner 10 keV, Depth≈109 nm 30 keV, Depth ≈ 282 nm 100 keV, Depth ≈ 671 nm 1 MeV, Depth ≈ 3.5 μm

METHOD FOR MANUFACTURING SEMICONDUCTOR DEVICE HAVING VIA FORMED BY ION BEAM

PRIORITY CLAIM AND CROSS-REFERENCE

This application claims priority to U.S. Provisional Application No. 62/539,440 filed on Jul. 31, 2017, entitled "VIA MANUFACTURED BY FOCUSED ION BEAM, DEVICE HAVING VIA, AND MANUFACTURING THE SAME," the entire disclosure of which is incorporated herein by reference.

BACKGROUND

A photolithography process, which is relatively expensive, is contemporarily used to manufacture vias in a semiconductor device. A size of the vias is determined at least by a photolithography tool. An aspect ratio of the vias may be deteriorated when the size of the vias shrinks, if manufacturing of the vias relies on the photolithography process.

Research is being conducted to find an alternative method to manufacture vias/contacts in the semiconductor device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
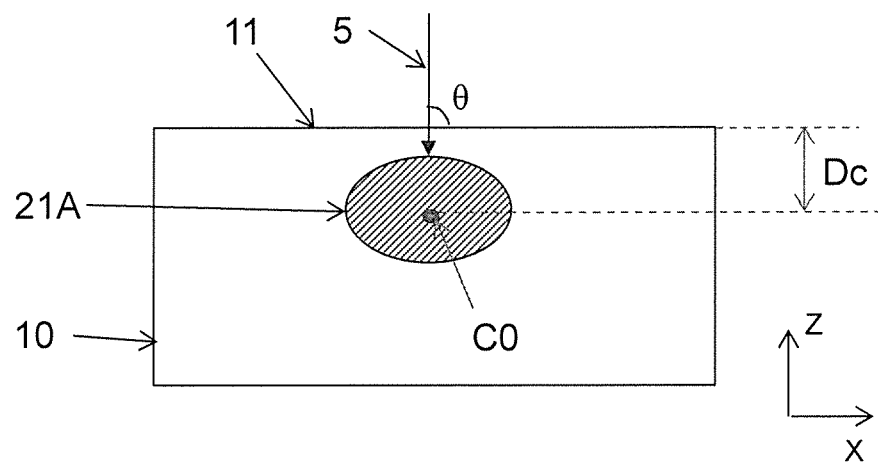
FIG. 1 illustrates a process step of a method for manufacturing a void according to embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly.

In the entire disclosure, "about" used to describe a parameter means that design error/margin, manufacturing error/margin, measurement error etc. are considered to define the parameter. Such a description should be recognizable to one of ordinary skill in the art.

Figure 2:
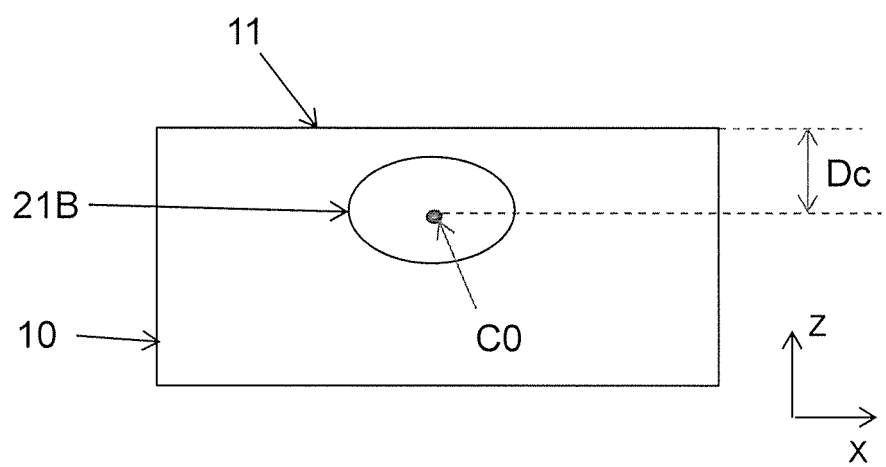
FIG. 2 illustrates a process step of a method for manufacturing a void according to embodiments of the present disclosure.
Figure 3A:
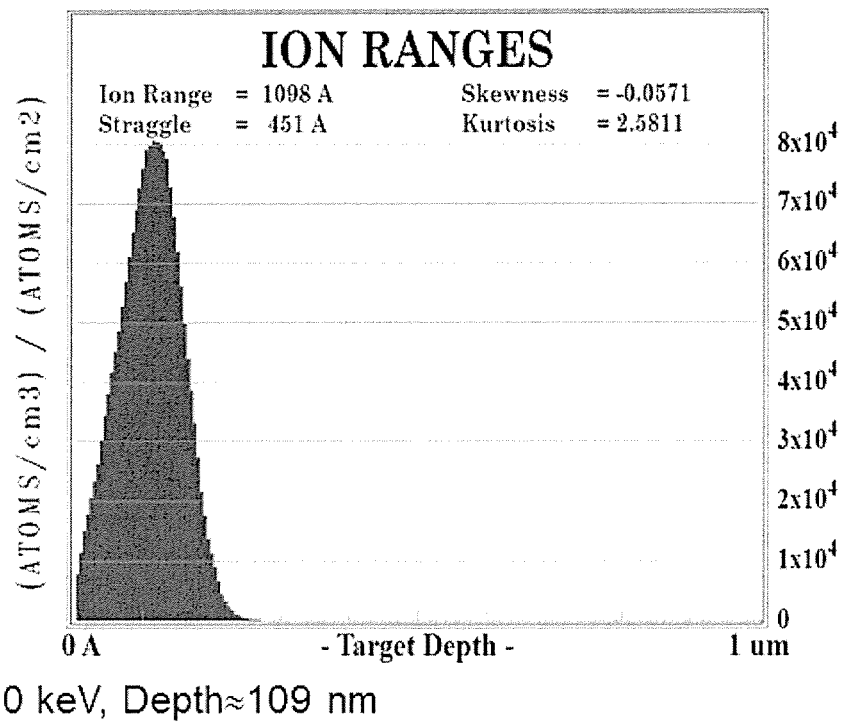
FIG. 3A illustrates a simulated relation between a depth of a void formed in a silicon substrate and an acceleration voltage applied to generate a focused helium beam to form the void in the silicon substrate.
Figure 3B:
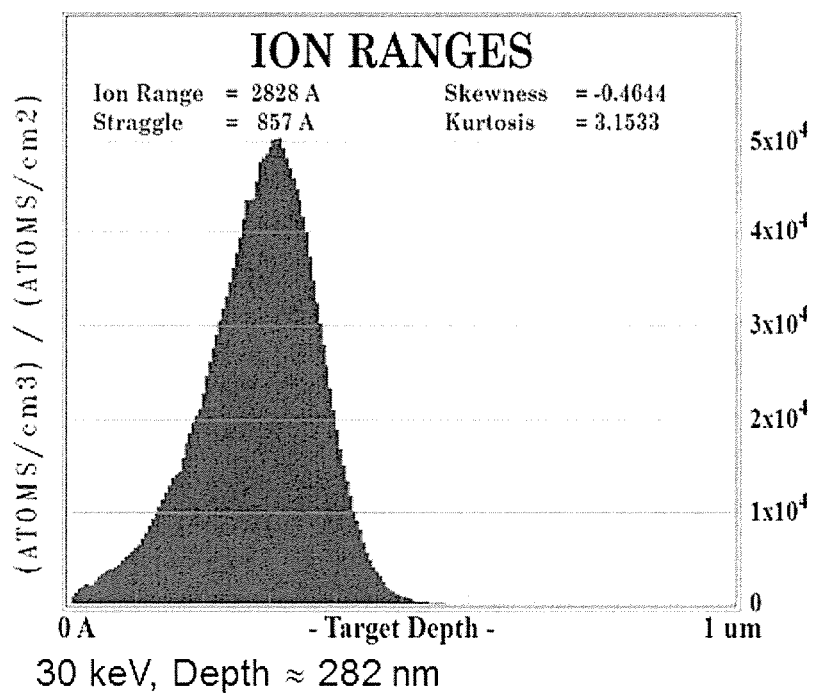
FIG. 3B illustrates a simulated relation between a depth of a void formed in a silicon substrate and an acceleration voltage applied to generate a focused helium beam to form the void in the silicon substrate.
Figure 3C:
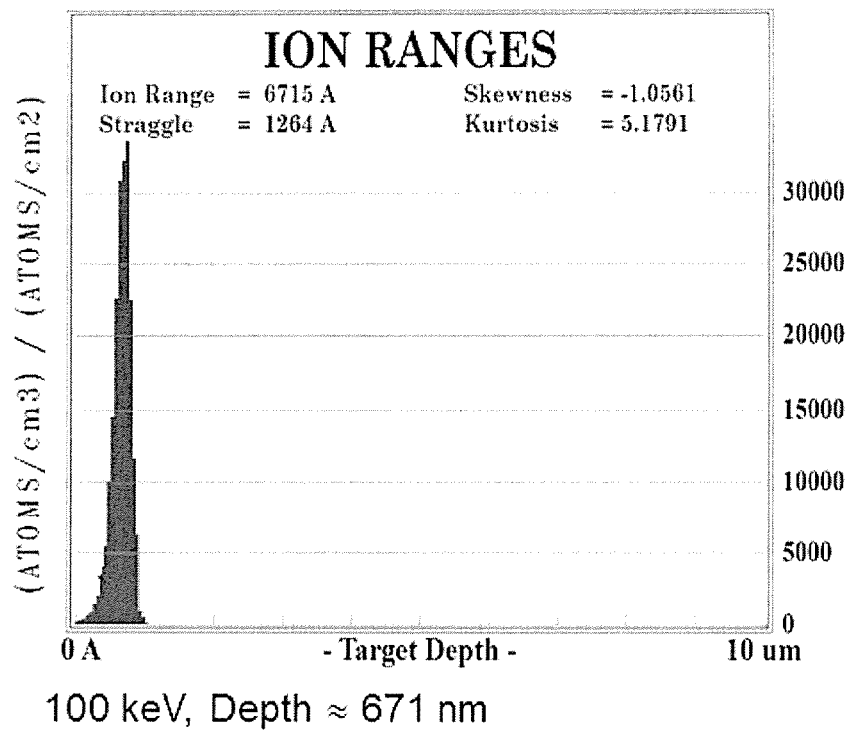
FIG. 3C illustrates a simulated relation between a depth of a void formed in a silicon substrate and an acceleration voltage applied to generate a focused helium beam to form the void in the silicon substrate.
Figure 3D:
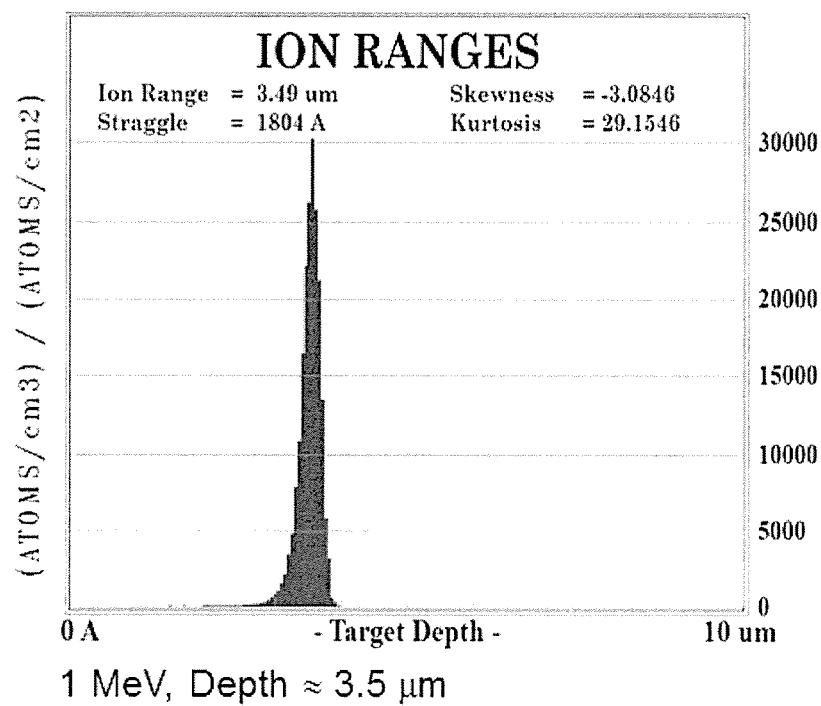
FIG. 3D illustrates a simulated relation between a depth of a void formed in a silicon substrate and an acceleration voltage applied to generate a focused helium beam to form the void in the silicon substrate.
Figure 3E:
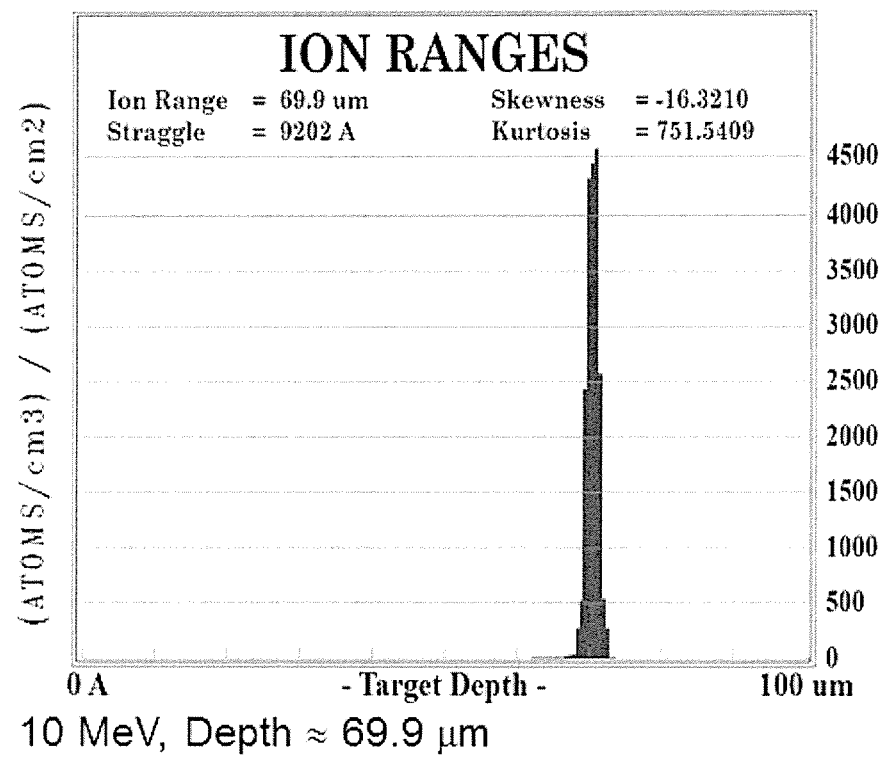
FIG. 3E illustrates a simulated relation between a depth of a void formed in a silicon substrate and an acceleration voltage applied to generate a focused helium beam to form the void in the silicon substrate.
Figure 3F:
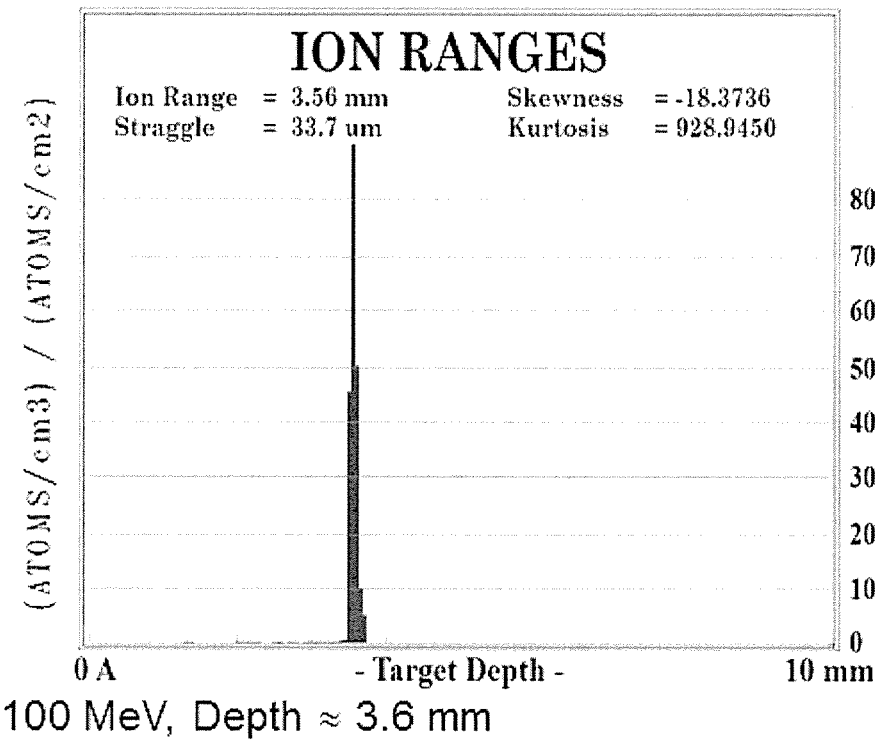
FIG. 3F illustrates a simulated relation between a depth of a void formed in a silicon substrate and an acceleration voltage applied to generate a focused helium beam to form the void in the silicon substrate.

FIGS. 1 and 2 illustrate process steps of a method for manufacturing a void according to embodiments of the present disclosure.

Referring to FIG. 1, in some embodiments, an ion beam 5 bombards a first region 21A (i.e., a target location) in a substrate 10 such that a structure of the bombarded first region 21A is changed. According to some embodiments, some atoms of the substrate 10 at the target location, i.e., the first region 21A, are dislocated by ion bombarding.

The substrate 10 is a semiconductor substrate made of, for example, one of Si, Ge, SiGe, SiC, SP, SiPC, InP, InAs, GaAs, AlInAs, InGaP, InGaAs, GaAsSb, GaPN, and AlPN. The substrate 10 can be pre-doped with impurities with a predetermined doping concentration, prior to bombarding the first region 21A. That is, the substrate 10 is either an N-type substrate or a P-type substrate, suitable to manufacture semiconductor devices such as transistors, according to some embodiments. In some embodiments, regions of the substrate 10 can have different semiconductor types. For example, the substrate 10 can include P-type semiconductor regions and N-type semiconductor regions alternately disposed with the P-type semiconductor regions along X axis (or Y axis which is not shown and perpendicular to X axis and Z axis). Although not shown, the substrate 10 can include preformed structures including, but not limited to, semiconductor fins, and isolation regions such as shallow trench isolation (STI) disposed among the structures. In other embodiments, although not shown, the substrate can include preformed devices including, but not limited to, transistors and/or wirings/contacts connected to the transistors.

In some embodiments, the substrate 10 is made of an insulating material including, but not limited to, silicon oxide, silicon nitride, SiON, SiOCN, spin-on-glass (SOG), or fluoride-doped silicate glass (FSG).

An incident angle $\theta$ of the ion current (or the ion beam 5), defined to be an angle between incident ion current (or a travel direction of the ions) and an exterior upper surface 11 of the substrate 10, is from about 0.01° to about 179.99°. In some embodiments, the incident angle $\theta$ of the ion current is from about 45° to about 135°. In some embodiments, the incident angle $\theta$ of the ion current is from about 85° to about 95°. In some embodiment, the incident angle $\theta$ of the ion current is about 90°.

In some embodiments, the ion beam, such as helium ion beam, hydrogen ion beam, neon ion beam, or gallium ion beam, is used to bombard the substrate 10. In some embodiments, the ion beam is a focused ion beam (FIB). According to some embodiments, in a case in which a focused helium beam is applied, helium atoms bombarding the target region effuse from associated coalesced bubbles. The bubbles can diffuse into the substrate 10, remain in the bombarded first region 21A, and/or escape from the substrate 10.

In some embodiments, a size of the first region 21A bombarded by an ion beam or a focused ion beam can be shrunk to sub 10-nanometer. In this case, the first void 21

(shown in FIG. 2) formed based on the bombarded first region 21A has a width (or a diameter) of 10 nm or less. The present disclosure, however, is not limited thereto.

In some embodiments, the location of the bombarded first region 21A can be precisely controlled and formed directly due to an extremely small size of an ion beam. In some embodiments, no photoresist pattern is required to bombard the first region 21A. Accordingly, the direct writing, for example, by an ion beam instead of other fabrication processes including photography, followed by a thermal annealing process, can be relatively easier to manufacture a void at a desired location at a relatively lower manufacturing cost.

In some embodiments, the substrate 10 includes one or more alignment marks (not shown) recognizable by a machine to perform the method according to some embodiments of the present disclosure, such that the location of the first region 21A to be ion bombarded can be programmed to the machine with respect to the location of the alignment marks of the substrate 10 prior to bombarding the first region 21A. The machine to bombard the first region 21A can recognize the alignment marks of the substrate 10 can apply the ion beam, such as a focused ion beam, into the programmed location to bombard the first region 21A in the substrate 10.

According to some embodiments, based on information including a material of the substrate 10, the incident angle $\theta$, a size of the ion beam, an acceleration voltage applied to generate the ion beam, a type of ions, and current of ions, a depth of the bombarded first region 21A (i.e., a distance Dc along Z axis from the exterior surface 11 of the substrate 10 to a center C0 of the bombarded first region 21A, or a shortest distance from the exterior surface 11 of the substrate 10 to the bombarded first region 21A), can be determined, or vice versa. For example, upon determination the material of the substrate 10, the incident angle $\theta$, the size of the ion beam, the type of ions, current of ions, and the depth Dc of the void to be formed, the acceleration voltage applied to generate the ion beam can be determined.

In some embodiments, in a case in which the substrate 10 is a crystalline material, after bombarding by, for example, an ion beam or a focused ion beam, a crystalline structure of the bombarded first region 21A is changed and becomes amorphous, as the bombarded ions cause dislocations of the atoms in the first region 21A and thus change crystalline structure. The bombarded first region 21A has a relatively higher stress than the remaining regions of the substrate 10 not being bombarded. The present disclosure, however, is not limited thereto.

In other embodiments, in a case in which the substrate 10 is a non-crystalline material, after bombarding by, for example, an ion beam or a focused ion beam, a structure of the bombarded first region 21A is changed, as the bombarded ions cause dislocations of the atoms in the first region 21A. Thus, the bombarded first region 21A has a relatively higher stress than the remaining regions of the substrate 10 not being bombarded.

Referring to FIG. 2, after forming the bombarded first region 21A in the substrate 10, the substrate 10 is subject to a thermal annealing process, according to some embodiments, such that the bombarded first region 21A is converted to a first void 21. The thermal annealing process converts the bombarded first region 21A to the first void 21. The thermal annealing process can be rapid thermal annealing (RTA), microwave annealing (MWA), laser anneal, etc. In some embodiments, the annealing temperature can be from about 50° C. to about 1300° C. In other embodiments, the annealing temperature is from about 600° C. to about 800° C. The ramp rate can be about 0.1° C./s to about 1000° C./s in some embodiments. The ramp rate can be about 50° C./s to about 200° C./s in other embodiments. The duration of thermal annealing is from about 1 second to about 24 hours in some embodiments. The duration of thermal annealing is from about 1 minute to about 10 minutes in other embodiments. The present disclosure however, is not limited thereto.

FIGS. 3A-3F illustrate a simulated relation between depths of voids formed in a silicon substrate and acceleration voltages applied to generate focused helium beams to form the voids in the silicon substrate. Here, the incident angle $\theta$ is maintained at 90° and the size of the focused ion beam is 0.5 nm.

According to the relation between the depths of the voids and the acceleration voltages applied to generate the focused helium beams used to make the voids, the higher acceleration voltage is applied, the deeper the via can be formed, as shown in FIGS. 3A-3F. For example, in a case in which the acceleration voltage of 10 keV is applied to generate a focused helium beam, a center of the via to be made by the focused helium beam is 109 nm according to the simulation result shown in FIG. 3A, and in a case in which the acceleration voltage of 100 MeV is applied to generate a focused helium beam, a center of the via to be made by the focused helium beam is 3.6 mm according to the simulation result shown in FIG. 3F.

In some embodiments, by maintaining the lateral location of the focused ion beam (such as the focused helium beam), a via comprised of a plurality of voids in Z axis can be formed in a substrate by adjusting the accelerate voltage from a first predetermined acceleration voltage to a second predetermined acceleration voltage, in a case in which the incident angle $\theta$ of the ion current is 90°.

Here, the adjustment of the accelerate voltage can be a step mode (i.e., a subsequent acceleration voltage is increased/decreased with a predetermined value or percentage with respect to a precedent acceleration voltage immediately prior to the subsequent acceleration voltage), or the adjustment of the accelerate voltage can be a continuous mode (i.e., the acceleration voltage is continuously adjusted between the first and second predetermined acceleration voltages), or a mixed mode thereof in which one section between the first predetermined acceleration voltage and the second predetermined acceleration voltage is a step mode and another section between the first predetermined acceleration voltage and the second predetermined acceleration voltage is a continuous mode.

One of the first and second predetermined acceleration voltages can be a threshold acceleration voltage at which the focused ion beam can form the shallowest portion of the via at the surface of the substrate, and the other of the first and second predetermined acceleration voltages can be the greatest acceleration voltage at which the focused ion beam can form the deepest portion of via. In some embodiments, the first predetermined acceleration voltage is about 0.1 keV to 10 keV and the second predetermined acceleration voltage is about 100 MeV to 200 MeV. In other embodiments, the first predetermined acceleration voltage is about 1 keV to 5 keV and the second predetermined acceleration voltage is about 50 keV to 100 keV.

One of ordinary skill in the art should understand the above-described step mode and continuous mode are merely examples to form a via. The present disclosure, however, is not limited thereto. For example, the via can includes a first group of voids formed first, and a second group of voids formed after the first group of voids and disposed among the first group of voids.

In some embodiments, a beam size of the ion beam such as the focused ion beam is in a range from about 0.5 nm to about 50 nm. In other embodiments, the beam size of the ion beam such as the focused ion beam is in a range from about 1 nm to about 20 nm. In some embodiment, current of ion is in a range from about 0.1 fA to about 1 mA or from about 1 pA to about 1 µA.

Additional information as to use a focused ion beam to manufacture a semiconductor can be referred to U.S. Non-Provisional application Ser. No. 15/454,118 filed on Mar. 9, 2017, entitled "METHOD FOR FORMING STRESSOR, SEMICONDUCTOR DEVICE HAVING STRESSOR, AND METHOD FOR FORMING THE SAME." The disclosure of which is incorporated herein by reference.

The features of a via including a plurality of voids formed by a method according to embodiments of the present disclosure is to be described below with reference to FIGS. 4A to 6.

Figure 4A:
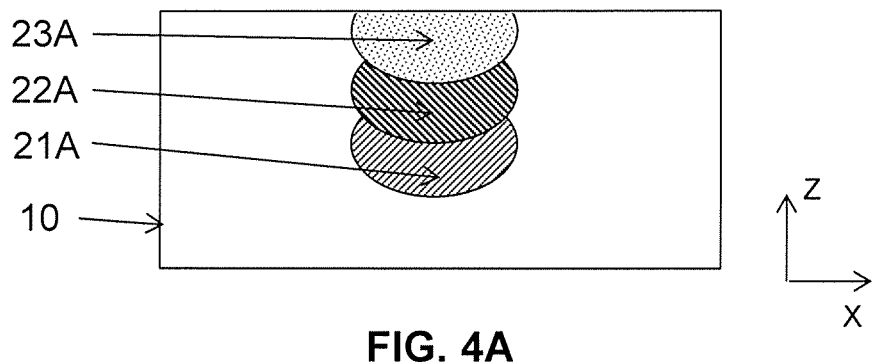
FIG. 4A illustrates a process step of a method for manufacturing a via according to embodiments of the present disclosure.
Figure 4B:
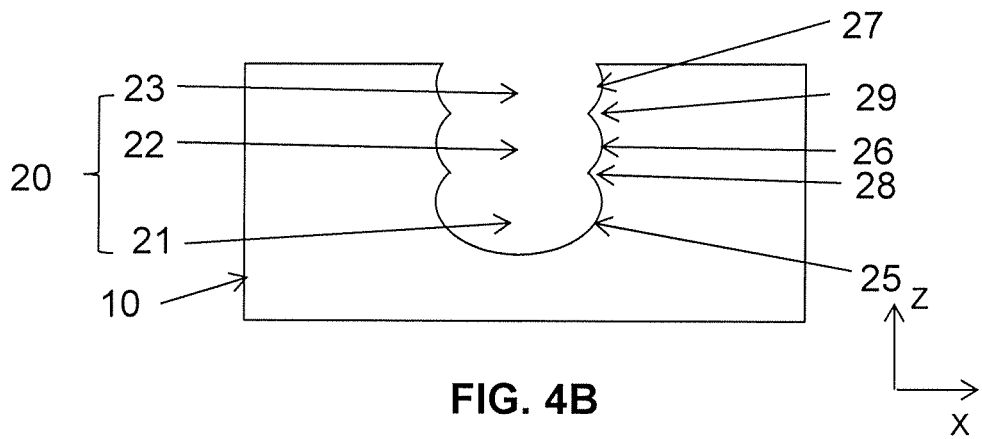
FIG. 4B illustrates a process step of a method for manufacturing a via according to embodiments of the present disclosure.

FIGS. 4A and 4B show process steps of a method for manufacturing a via according to embodiments of the present disclosure.

Referring to FIGS. 1 and 4A, additional regions such as second and third regions 22A and 23A above the bombarded first void 21A can be bombarded by the same ion beam applied to the first region 21A but with different acceleration voltages. The present disclosure, however, is not limited thereto. For example, the incident angle θ, the size of the ion beam, the type of ions, and/or current of ions can also be adjusted according to design particulars.

Followed by a thermal annealing process described with reference to FIG. 2, the bombarded first, second, and third regions 21A, 22A, and 23A are converted to the first, second, and third voids 21, 22, and 23, as shown in FIG. 4B, according to some embodiments. The sequence of the process steps is not limited to bombarding the first, second, and third regions 21A, 22A, and 23A and thereafter performing the annealing process. According to other embodiments, a thermal annealing process can be performed between bombarding two of the first, second, and third regions 21A, 22A, and 23A, so as to convert the bombarded region to a void before bombarding another region.

According to some embodiments, adjacent voids among the first to third voids 21, 22, and 23 partially overlap with each other in Z axis, such that a via 20, constituted by the first to third voids 21, 22, and 23, is formed in the substrate 10.

In some embodiments, a void, if formed in a solid material, can have a sphere structure or an ellipsoidal structure. A horizontal cross-sectional view (i.e., cut by a plane perpendicular to Z axis) of the void has a shape corresponding to a shape of the ion beam 5. In a case in which the ion beam has a circular shape, the horizontal cross-sectional view (i.e., cut by a plane perpendicular to Z axis) of the third to third voids 21, 22, and 23 has a circular shape. The present disclosure, however, is not limited thereto.

In some embodiments, due to a change in shape of the same void in Z axis, the first to third voids 21, 22, and 23 have concave surfaces (portions) 25, 26, and 27, respectively. The concave surfaces (portions) 25 and 26 of the first and second voids 21 and 22 form a convex surface (portion) 28, and the concave surfaces 26 and 27 of the second and third voids 22 and 23 form a convex surface (portion) 29. In other words, along Z axis, a sidewall of the via 20 includes a plurality of concave surfaces (portions) 25, 26, and 27 and a plurality of convex portions 28 and 29 alternatively disposed with the plurality of concave surfaces (portions) 25, 26, and 27. Here, the convex surface (or portion) 28 protrudes from the concave (or portion) 25 of the first void 21 and the concave (or portion) 26 of the second void 22 towards a center of the first and second voids 21 and 22, and the convex surface (or portion) 29 protrudes from the concave (or portion) 26 of the second void 22 and the concave (or portion) 27 of the third void 23 towards a center of the second and third voids 22 and 23.

In some embodiments, the first region 21A is bombarded prior to bombarding the second and third regions 22A and 23A. The present disclosure is not limited thereto. In other embodiments, the first region 21A can be bombarded after one of the second and third regions 22A and 23A is bombarded and before the other one of the second and third regions 22A and 23A. In other embodiments, the first region 21A can be bombarded after both the second and third regions 22A and 23A are bombarded. In some embodiments, the second region 22A is formed before bombarding the third region 23A, and in other embodiments, the second region 22A is bombarded after bombarding the third region 23A.

In some embodiments, one of the first to third regions 21A, 22A, and 23A is bombarded immediately after another of the first to third regions 21A, 22A, and 23A. In other embodiments, one of the first to third regions 21A, 22A, and 23A is bombarded after another of the first to third regions 21A, 22A, and 23A, with a predetermined time delay therebetween.

The number of voids, the number of the concave surfaces (or portions), the number of convex surfaces (or portions) of the via are not particularly limited to those shown in the drawings. According to some embodiments, the number of voids, the number of the concave surfaces (or portions), the number of convex surfaces (or portions) of the via can be more or less than those shown in the drawings. In other words, the number of voids (or beam shots) is not limited to three.

In a case in which the substrate 10 has a crystal structure prior to forming the via 20, a sidewall portion of the via 20 becomes an amorphous structure after being bombarded by the ion beam or the focused ion beam. According to some embodiments, the thermal annealing process converts (or restores) at least a portion or an entirety of the amorphous structure in the sidewall portion of the via 20 to the crystal structure.

Figure 5:
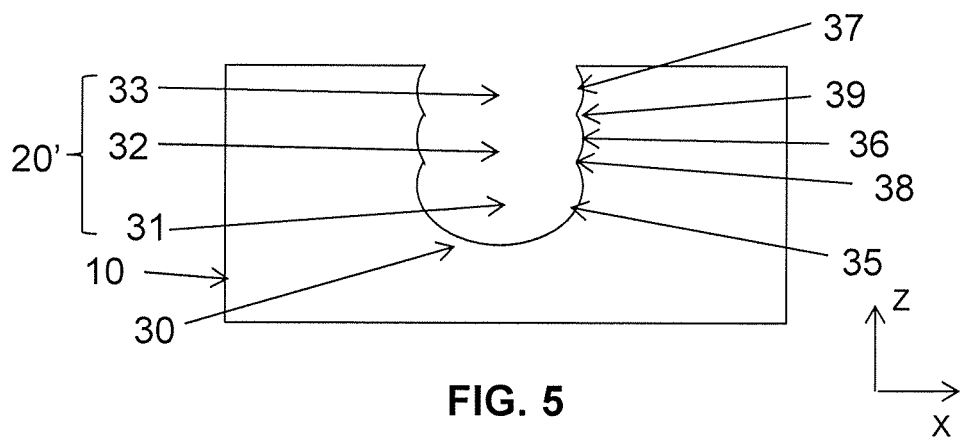
FIG. 5 shows a conceptual cross-sectional view of a via formed in a substrate by a method according to embodiments of the present disclosure.

FIG. 5 shows a conceptual cross-sectional view of a via formed in a substrate by a method according to embodiments of the present disclosure.

Referring to the drawings, after forming the via 20 shown in FIG. 4A or FIG. 4B, a trimming process can be performed to reduce a degree of concave/convex on the sidewall of the via 20. As such, after the trimming process, the first to third voids 21, 22, and 23 of the via 20 are converted to voids 31-33 of a via 20', respectively, as shown in FIG. 5. Accordingly, the concave surfaces (or portions) 25, 26, and 27 and the convex surfaces (or portions) 28 and 29 are converted to concave surfaces (or portions) 35, 36, and 37 and convex surfaces (or portions) 38 and 39, respectively. In some embodiments, a degree of concave/convex of the concave surfaces (or portions) 35, 36, and 37 and the convex surfaces (or portions) 38 and 39 is reduced by the trimming process, as compared to a degree of concave/convex of the concave surfaces (or portions) 25, 26, and 27 and the convex surfaces (or portions) 28 and 29. In this case, a ripple structure on the sidewall of the via 20' can be reduced, as compared to a ripple structure on the sidewall of the via 20.

According to some embodiments, the trimming process is a plasma treatment with $CH_xF_y$ (x=0 to 4, y=0 to 4, x+y=4) for about 1 second to about 1 hour or from 30 seconds to 2 minutes. In other embodiments, the trimming process includes oxidizing the sidewall of the via 20 and dipping the substrate 10 in a buffered HF or BHF to remove the oxidized layer on the sidewall of the via 20, in a case in which the substrate 10 is a semiconductor substrate such as a silicon substrate. In other embodiments, the trimming process includes dipping the substrate 10 in a buffered HF or BHF, in a case in which the substrate 10 is made of silicon oxide. Since an etching rate of the convex surface (or portion) protruding from the other portions is faster than that of the concave surface (or portions), the convex surface (or portion) is to be rounded by the trimming process to reduce the ripple structure thereof.

Figure 6:
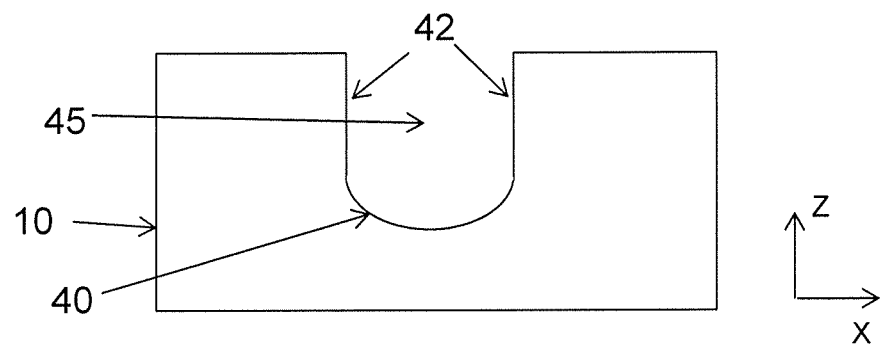
FIG. 6 shows a conceptual cross-sectional view of a via formed in a substrate by a method according to embodiments of the present disclosure.

FIG. 6 shows a conceptual cross-sectional view of a via formed in a substrate by a method according to embodiments of the present disclosure.

According to some embodiments, after a trimming process, the concave surfaces (or portions) and the convex surfaces (or portions) disappear as shown in FIG. 6, in a case in which the trimming process is sufficiently performed to the via 20 or the via 20'. In this case, a via 45 with substantially straight sidewalls 42 in the cross-sectional view can be obtained.

The above-described via can be formed by forming a plurality of voids on each other in Z axis. The present disclosure is not limited thereto. According to other embodiments, a via can be formed by connecting a plurality of voids in Z axis and also in a lateral direction (i.e., X axis or Y axis (not shown) or both).

Figure 7:
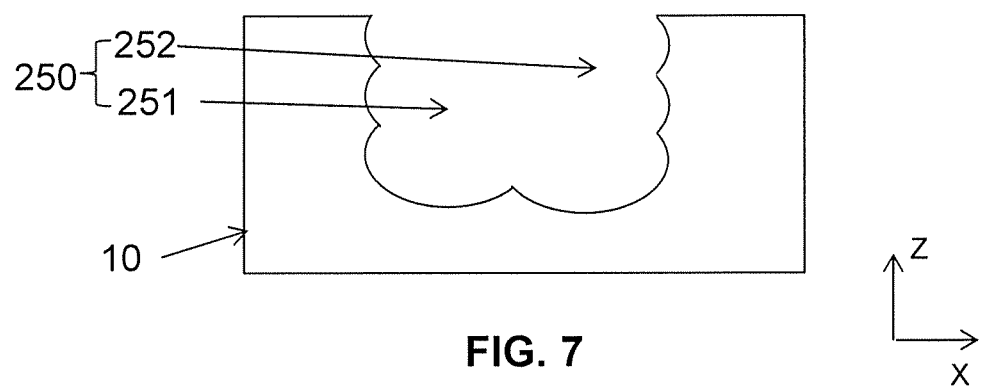
FIG. 7 shows a conceptual cross-sectional view of a via formed by a method according to embodiments of the present disclosure.

For example, as shown in FIG. 7, a via 250 can be formed of two columns of voids each manufactured according to the method described above, one column 251 of voids stacking on each other in Z axis and another column 252 of voids stacking on each other in Z axis and connected to the one column 251. In this case, a sidewall between the two columns 251 and 252 of voids does not exist. Thus, a size of the via 250 in the lateral direction can be expanded and is not limited to a size of the ion beam used to manufacture the voids. Accordingly, a much greater size of the via can be obtained when more voids are connected to each other in the lateral direction.

Figure 8A:
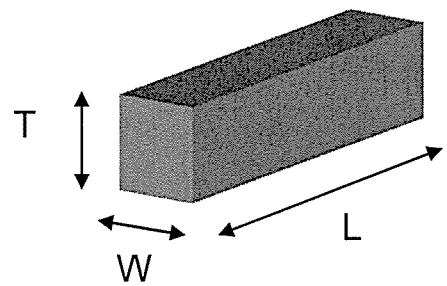
FIG. 8A shows an exemplary structure of a via formed by a method according to embodiments of the present disclosure.

FIG. 8A shows an exemplary structure of a via manufactured by a method according to embodiments of the present disclosure.

Referring to FIG. 8A, in some embodiments, a shape of a via comprised of a plurality of voids can be a rectangular cuboid, without considering concave/convex surfaces (or portions) between adjacent voids. Each of a width W, a length L, and a height H of the rectangular cuboid ranges from about 1 nm to about $10^5$ nm and a ratio between two of the width W, length L, and height H ranges from about $10^{-5}$ to about $10^5$, although the present disclosure is not limited thereto. In some embodiments, the height H is aligned with Z axis. According to some embodiments, an aspect ratio of the via (i.e., a ratio in the depth in Z axis to a width in a lateral direction such as X axis) can be 1000 or greater.

A rectangular-cuboid shape shown in FIG. 8A is merely an example; the shape of the via, however, is not limited thereto. In other embodiments, the via can have a cubic shape, an ovoid shape, a tetrahedron shape, a hexagonal prism, etc. In other embodiments, the via has a square shape, a rectangular shape, an oval shape, a triangle shape, and a hexagon shape, when viewed along an incident direction the ion beam. In other embodiments, any other shape can be obtained by direct writing through the ion beam.

Figure 8B:
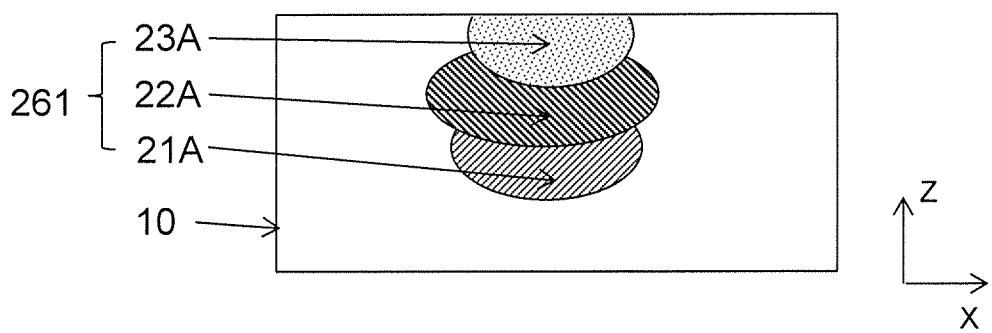
FIG. 8B shows an exemplary structure of a via formed by a method according to embodiments of the present disclosure.

According to other embodiments, as shown in FIG. 8B, a plurality of bombarded regions 21A, 22A, and 23A to form a bombarded integral region 261 can have different sizes, in accordance with design particulars. For example, the second region 22A has the largest size among the plurality of bombarded regions 21A, 22A, and 23A. The present disclosure, however, is not limited to. In some case, the uppermost or the lowermost one of the plurality of bombarded regions 21A, 22A, and 23A (or any other void not shown) can have the largest size among the plurality of bombarded regions 21A, 22A, and 23A.

Figure 8C:
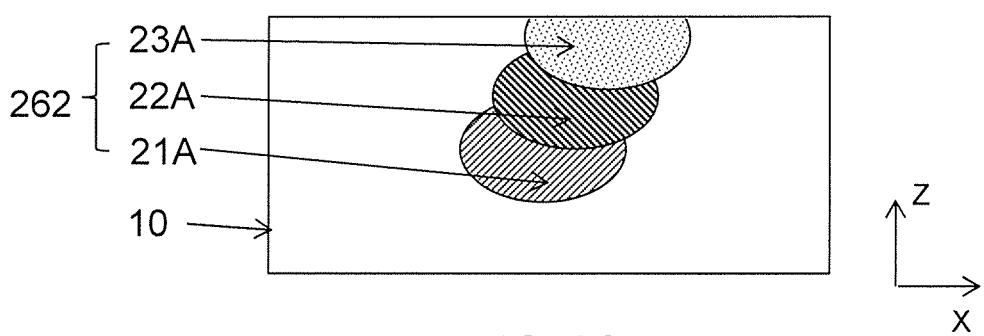
FIG. 8C shows an exemplary structure of a via formed by a method according to embodiments of the present disclosure.

According to other embodiments, as shown in FIG. 8C a plurality of bombarded regions 21A, 22A, and 23A can be stacked on each other in a direction, linearly or non-linearly, inclined to Z axis, and in this case, a via corresponding to an integral region 262 formed by the plurality of bombarded regions extends in a direction inclined to Z axis.

Figure 8D:
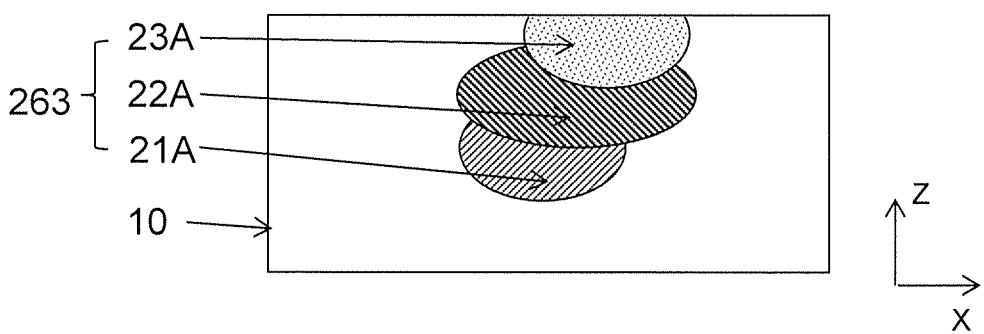
FIG. 8D shows an exemplary structure of a via formed by a method according to embodiments of the present disclosure.

According to some other, the configurations shown in FIGS. 8B and 8C can be combined, as shown in a bombarded integral region 263 in FIG. 8D.

Figure 8E:
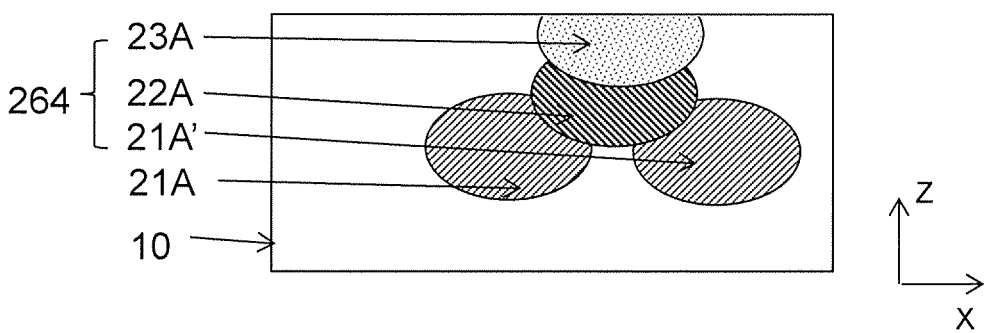
FIG. 8E shows an exemplary structure of a via formed by a method according to embodiments of the present disclosure.

According to other embodiments, an integral region 264, comprised of bombarded regions 21A, 21A' 22A, and 23A, having a T shape (or a branch shape) can be formed by bombarding additional one or more region 21A' spaced apart from the first region 21A but connected to the second region 22A, as shown in FIG. 8E.

Although not shown, in some embodiments, by performing the annealing process described above, the bombarded integral regions 261-264 can be converted to voids, respectively.

Figure 8F:
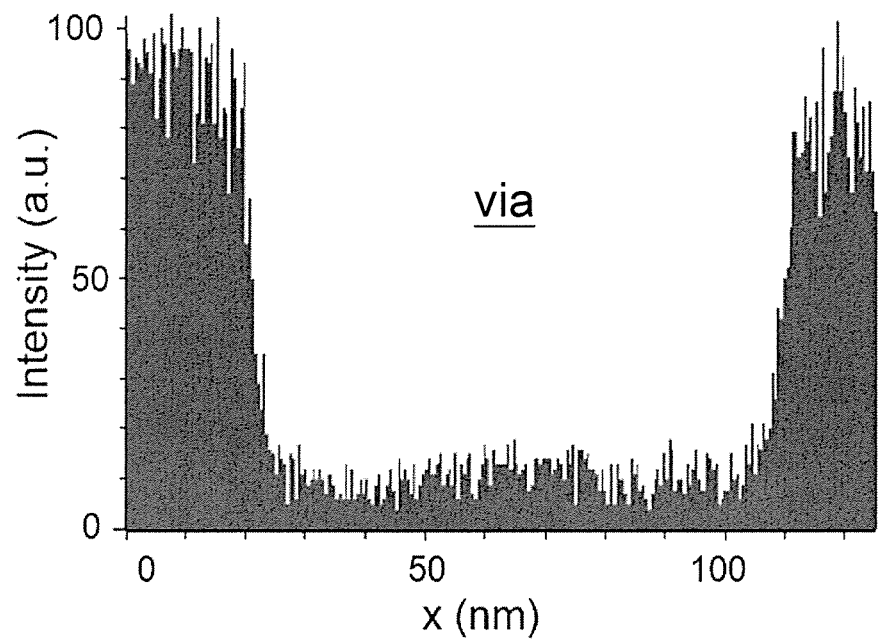
FIG. 8F shows an energy-dispersive x-ray spectroscopy (EDS) image of a via formed by a method according to embodiments of the present disclosure.
Figure 8G:
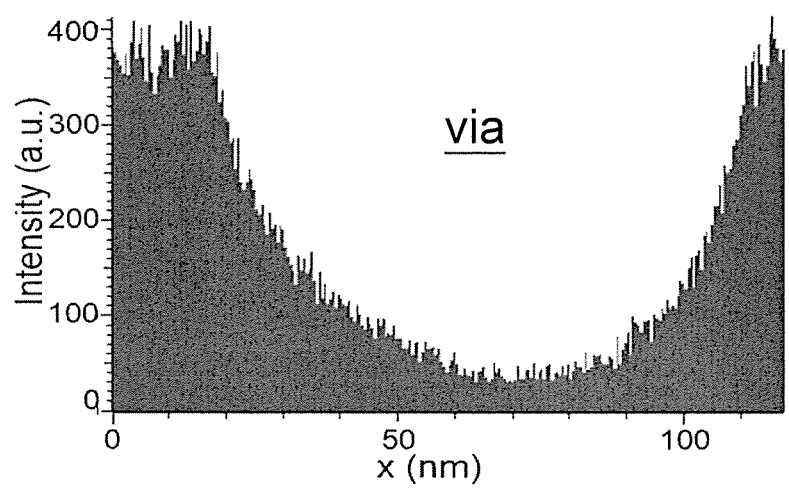
FIG. 8G shows an EDS image of a via formed by a method according to embodiments of the present disclosure.

FIG. 8F shows an energy-dispersive x-ray spectroscopy (EDS) image of a via, which was annealed at 600° C. for 3 minutes, and FIG. 8G shows an EDS image of another via, which was manufactured the same except that the via was annealed at 825° C. for 3 minutes. Referring to FIGS. 8F and 8G, structures of the voids can be modified in accordance with an annealing condition.

As described above, the via formed by the method according to embodiments of the present disclosure can have any shape and extend along any direction, according to the focused location of the focused ion beam and other process conditions, thereby allowing more design freedom.

As described above, a via is formed in a substrate by a method according to some embodiments. The present disclosure is not limited thereto. In other embodiments, a via or a void can be formed in a layer or a multilayer structure disposed on a substrate by a method according to some embodiments.

Figure 9:
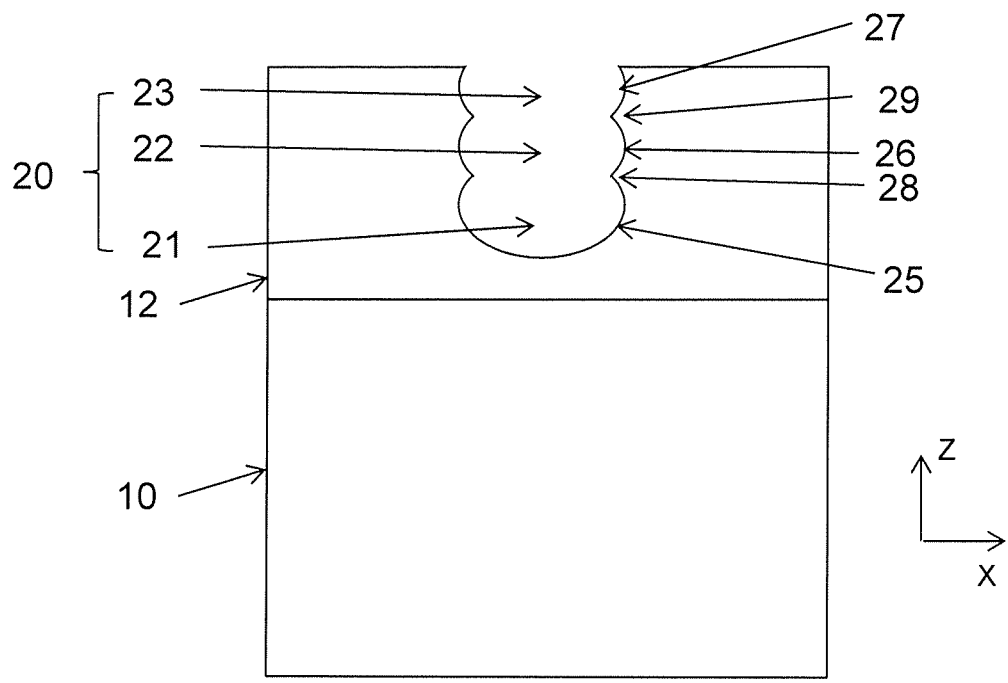
FIG. 9 shows a conceptual cross-sectional view of a via including a plurality of voids formed in a layer by a method according to embodiments of the present disclosure.

Referring to FIG. 9, a via 20 including a plurality of voids 21-23 is formed in a layer 12 disposed on a substrate 10 by a method according to some embodiments.

The layer 12 can be made of a material different from the substrate 10. In some embodiments, the substrate 10 is a support substrate and the layer 12 is a semiconductor layer such as a silicon (Si) layer, a germanium (Ge) layer, a silicon germanium (SiGe) layer, a gallium arsenide (GaAs) layer, and an indium gallium arsenide (InGaAs) layer. In a case in which the layer 12 is a semiconductor layer, the layer 12 can be pre-doped with impurities with a predetermined doping concentration, prior to forming the void 21. That is, the layer 12 is either an N-type layer or a P-type layer, suitable to manufacture semiconductor devices such as transistors, according to some embodiments. In some embodiments, regions of the layer 12 can have different semiconductor types. For example, the layer 12 can include P-type semiconductor regions and N-type semiconductor regions alternately disposed with the P-type semiconductor regions along X axis (or Y axis which is not shown and perpendicular to X axis and Z axis). Although not shown, the layer 12 can include preformed structures including, but not limited to, semiconductor fins, and isolation regions such as shallow trench isolation (STI) disposed among the structures. In other embodiments, although not shown, the substrate can include preformed devices including, but not limited to, transistors and/or wirings/contacts connected to the transistors.

In some embodiments, the layer 12 is made of an insulating material including, but not limited to, silicon oxide, silicon nitride, SiON, SiOCN, spin-on-glass (SOG), or fluoride-doped silicate glass (FSG). The present disclosure, however, is not limited thereto.

Although not shown, the layer 12 includes a multilayer structure. In this case, the void 20 can penetrate two or more layers, made of the same or different materials, of the multilayer structure.

The other features of the embodiments shown in FIG. 9 are the same as those described above. To avoid redundancy, overlapped descriptions will be omitted.

The via formed by the above-described method can be used to form a contact, in a case in which a conductive material fills with the via. Such features will be more apparent with the following descriptions.

Figure 10:
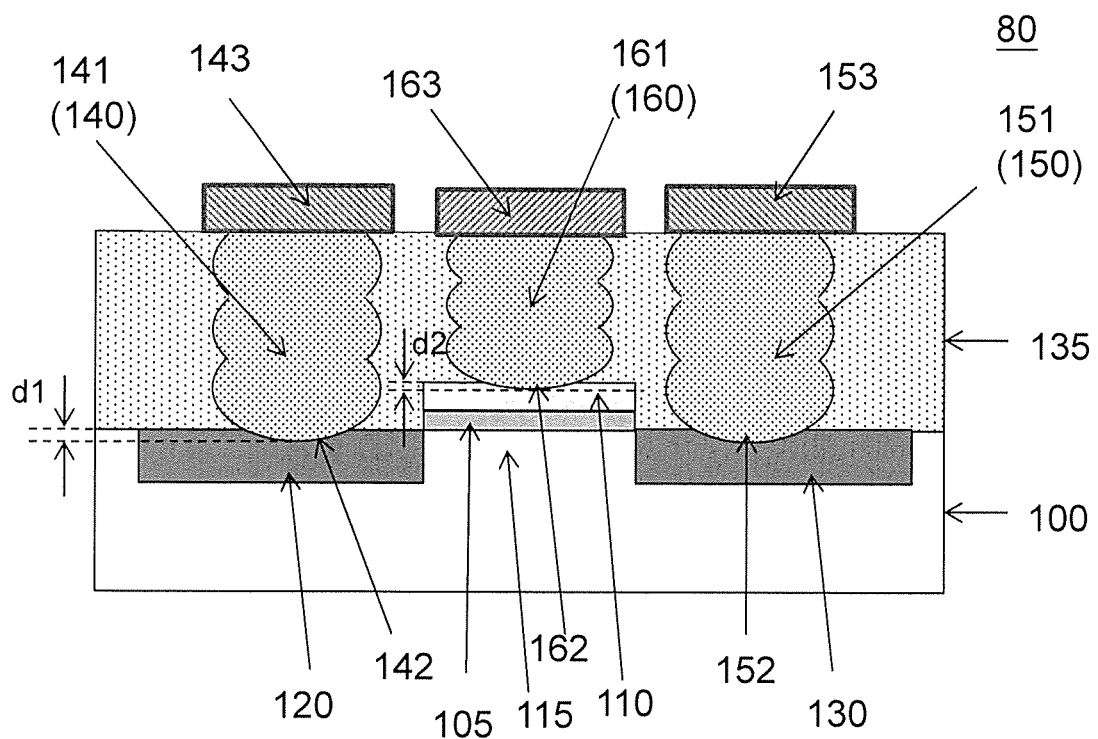
FIG. 10 shows a cross-sectional view of a semiconductor device according to some embodiments of the present disclosure.

FIG. 10 shows a cross-sectional view of a semiconductor device according to some embodiments of the present disclosure.

As shown in FIG. 10, a semiconductor device 80 is formed on a surface portion of a substrate 100 and includes a source region 120 and a drain region 130, a channel region 115 between the source region 120 and the drain region 130, a gate dielectric layer 105 over the channel region 115, and a gate electrode 110 over the gate dielectric layer 105.

The semiconductor device 80 further includes an insulating layer 135, for example, an interlayer dielectric layer, covering the source region 120, the gate electrode 110, and the drain region 130.

The semiconductor device 80 also includes a source contact 141, a drain contact 151, and a gate contact 161. The source contact 141 penetrates through the insulating layer 135, contacts with the source region 120, and electrically connects the source region 120 to a source wiring 143. The drain contact 151 penetrates through the insulating layer 135, contacts with the drain region 130, and electrically connects the drain region 130 to a drain wiring 153. The gate contact 161 penetrates through the insulating layer 135, contacts with the gate electrode 110, and electrically connects the gate electrode 110 to a gate wiring 163.

The source region 140, the drain region 150, and the channel region 115 are made of a semiconductor material such as silicon (Si), germanium (Ge), silicon germanium (SiGe), gallium arsenide (GaAs), and indium gallium arsenide (InGaAs). The source region 140 and the drain region 150 are heavily doped with impurities and the channel region 130 is undoped or lightly doped. In some embodiments, the source region 140, the drain region 150, and the channel region 115 are made of the same material as the substrate 100 (but with different doping concentrations). The present disclosure should not be limited thereto.

The gate dielectric layer 105 includes one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof.

The gate electrode 110 is made of one or more layers of metal material, such as poly-Si, poly-Si with silicide, Al, Cu, W, Ti, Ta, TiN, TaN, TiW, WN, TiAl, TiAlN, TaC, TaCN and TiSiN, or any other suitable materials. In some embodiments, one or more work function adjustment layers (not shown) may be interposed between the gate dielectric layer 105 and the gate electrode 110. The work function adjustment layers are made of a conductive material such as a single layer of TiN, TaN, TaAlC, TiC, TaC, Co, Al, TiAl, HfTi, TiSi, TaSi, NiSi, PtSi or TiAlC, or any other suitable materials, or a multilayer of two or more of these materials.

The insulating layer 135 is made of a dielectric layer including, but not limited to, silicon oxide, silicon nitride, SiON, SiOCN, spin-on-glass (SOG) or fluoride-doped silicate glass (FSG).

The source contact 141, the drain contact 151, and the gate contact 161 are made of an electrically conductive material respectively filling first through third vias 140, 150, and 160 penetrating through the insulating layer 135. The electrically conductive material includes one or more of Cu, W, Al, AlCu, TiN, TiW, Ti, Co, Ni, TaN, Ta, or any other suitable metals, or combination thereof.

According to some embodiments, one or more, or all of the first to third vias 140, 150, and 160 are formed by the above-described method for forming a via in a substrate or in a layer. Thus, the structural features of the first to third vias 140, 150, and 160 can be referred to those described above. To avoid redundancy, overlapped descriptions will be omitted here.

According to some embodiments, at the time of forming the first to third via 140, 150, 160, respective bottom voids thereof are partially penetrated into the source region 120, the drain region 130, and the gate electrode 110 to ensure sufficient contact areas, thereby improving electrical connections between the source contact 141 and the source region 120, the drain contact 151 and the drain region 130, and the gate contact 161 and the gate electrode 110. Thus, the source region 120, the drain region 130, and the gate electrode 110 respectively have dimples 142, 152, and 162, according to some embodiments. That is, upper surfaces of the source region 120, the drain region 130, and the gate electrode 110 are not flat and have curved portions recessed from other portions of the upper surfaces thereof.

According to some embodiments, the ion beam such as the focused ion beam used to form the first to third vias 140, 150, and 160 is more efficient to make a void in the semiconductor material constituting the source region 120 and the drain region 130, as compare to the material constituting the gate electrode 110. In this case, a first depth d1 of the first dimple 142 in the source region 120 is greater than a second depth d2 of the second dimple 142 in the gate electrode 110. The present disclosure is not limited thereto.

In other embodiments, the first depth d1 of the first dimple 142 in the source region 120 is equal to or less than the second depth d2 of the second dimple 142 in the gate electrode 110, in case in which the bottom void of the third via 160 is designed to bombard relatively deeper.

According to some embodiments, since the depth of the first to third vias 140, 150, and 160 can be individually controlled, a depth of one of the first to third dimples 142, 152, and 162 can be equal to, greater than, or less than a depth of another of the first to third dimples 142, 152, and 162.

FIGS. 11 to 16 illustrate process steps of a method for manufacturing the semiconductor device 80 shown in FIG. 10, according to some embodiments of the present disclosure.

Figure 11:
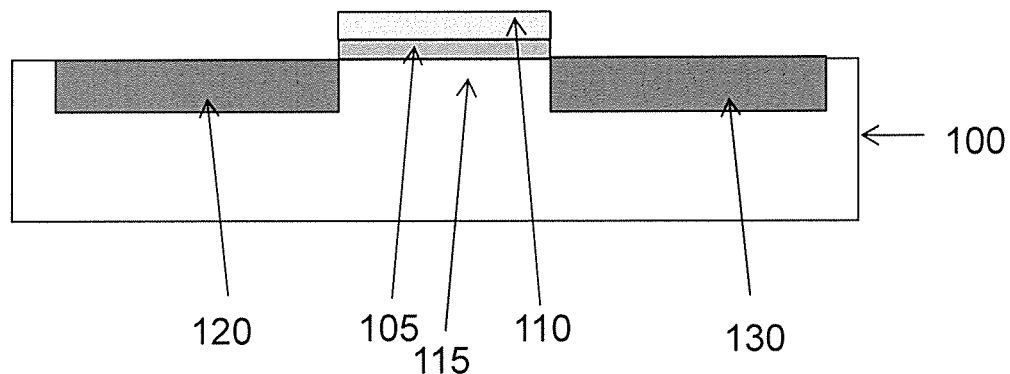
FIG. 11 illustrates a process step of a method for manufacturing a semiconductor device according to embodiments of the present disclosure.

Referring FIG. 11, the source region 120 and the drain region 130 are formed on opposite sides of the gate dielectric layer 105 and the gate electrode 110, so that the drain region 115 is defined by the source region 120, the drain region 130, the gate dielectric layer 105, and the gate electrode 110.

Figure 12:
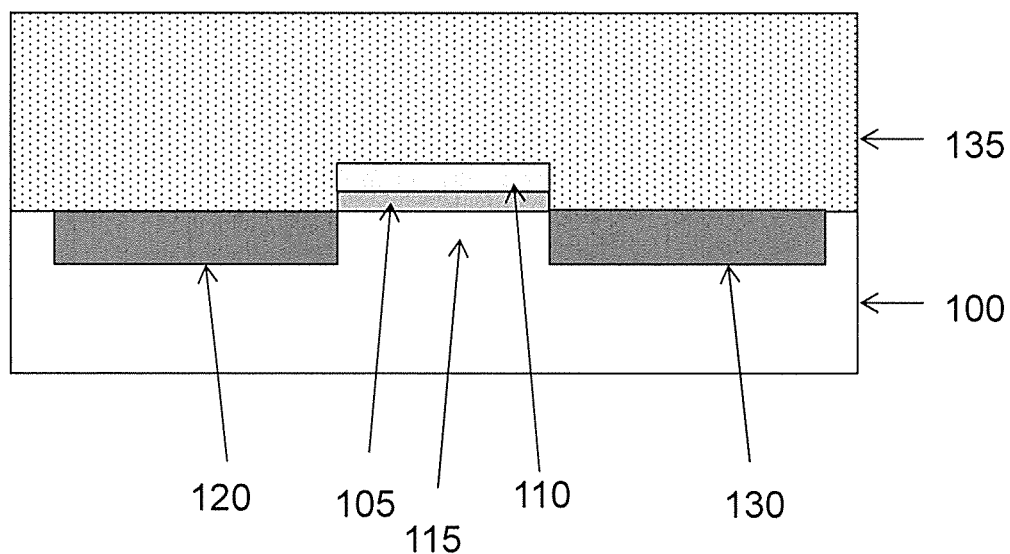
FIG. 12 illustrates a process step of a method for manufacturing a semiconductor device according to embodiments of the present disclosure.

Referring to FIG. 12, the insulating layer 135 is formed, for example, by low pressure chemical vapor deposition (LPCVD), plasma enhanced chemical vapor deposition (PECVD), flowable chemical vapor deposition (flowable CVD), or any other suitable processes, to cover the above structure formed in the process step shown in FIG. 11. Although not shown, a planarization process such as a chemical-mechanical polishing (CMP) process is performed to obtain a planarized surface of the insulating layer 135.

Figure 13:
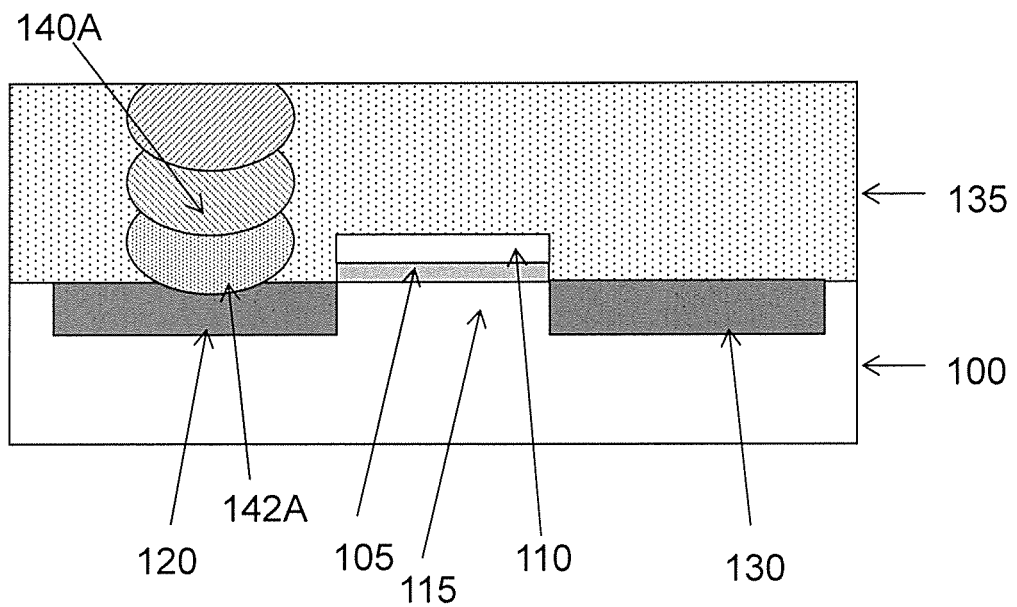
FIG. 13 illustrates a process step of a method for manufacturing a semiconductor device according to embodiments of the present disclosure.

Then, referring to FIG. 13, a first integral region 140A including a plurality of bombarded regions is formed according to the above-described method by an ion beam such as a focused ion beam. According to some embodiments, a region 142A in the source region 120 is also bombarded.

Figure 14:
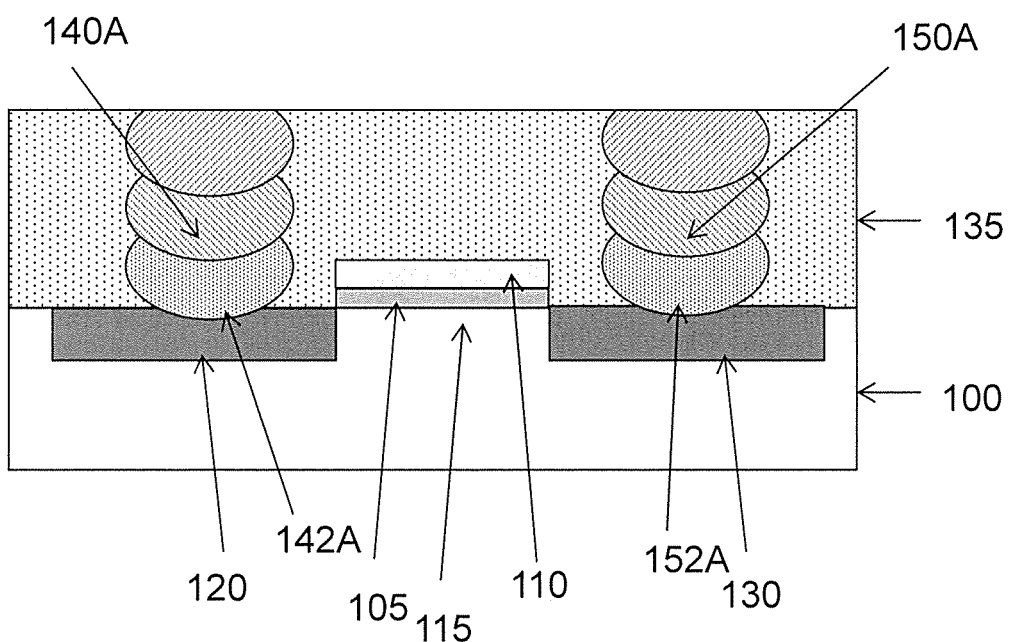
FIG. 14 illustrates a process step of a method for manufacturing a semiconductor device according to embodiments of the present disclosure.

Referring to FIG. 14, after forming the first integral region 140A, a second integral region 150A including a plurality of bombarded regions is formed according to the above-described method by an ion beam such as a focused ion beam. According to some embodiments, a region 152A in the drain region 130 is also bombarded.

Figure 15:
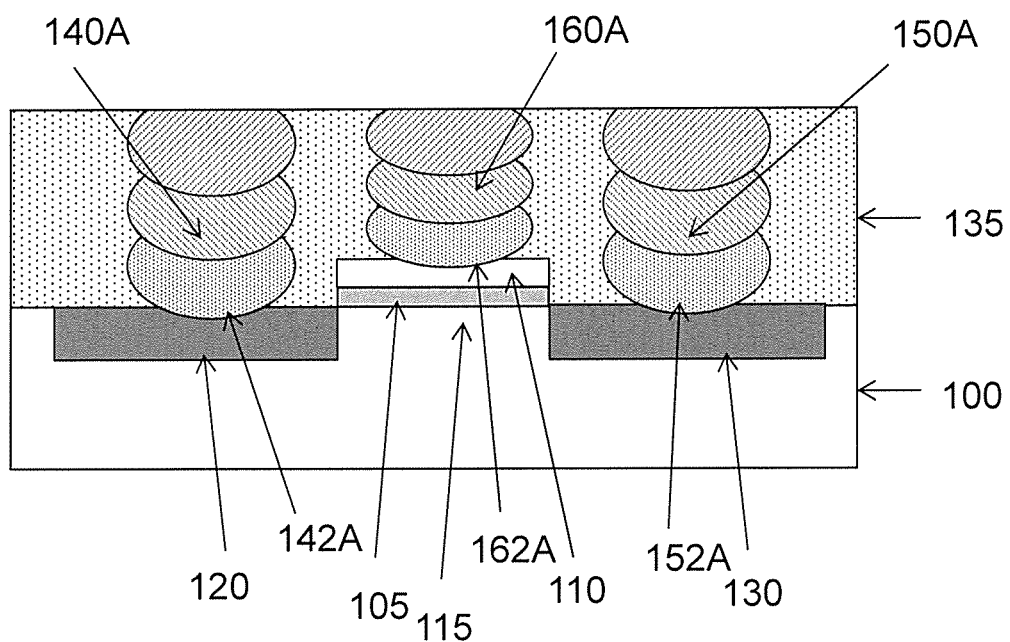
FIG. 15 illustrates a process step of a method for manufacturing a semiconductor device according to embodiments of the present disclosure.

Referring to FIG. 15, after forming the first integral region 140A and the second integral region 150A, a third integral region 160A including a plurality of bombarded regions is formed according to the above-described method by an ion beam such as a focused ion beam. According to some embodiments, a region 162A in the gate electrode 110 is also bombarded.

Figure 16:
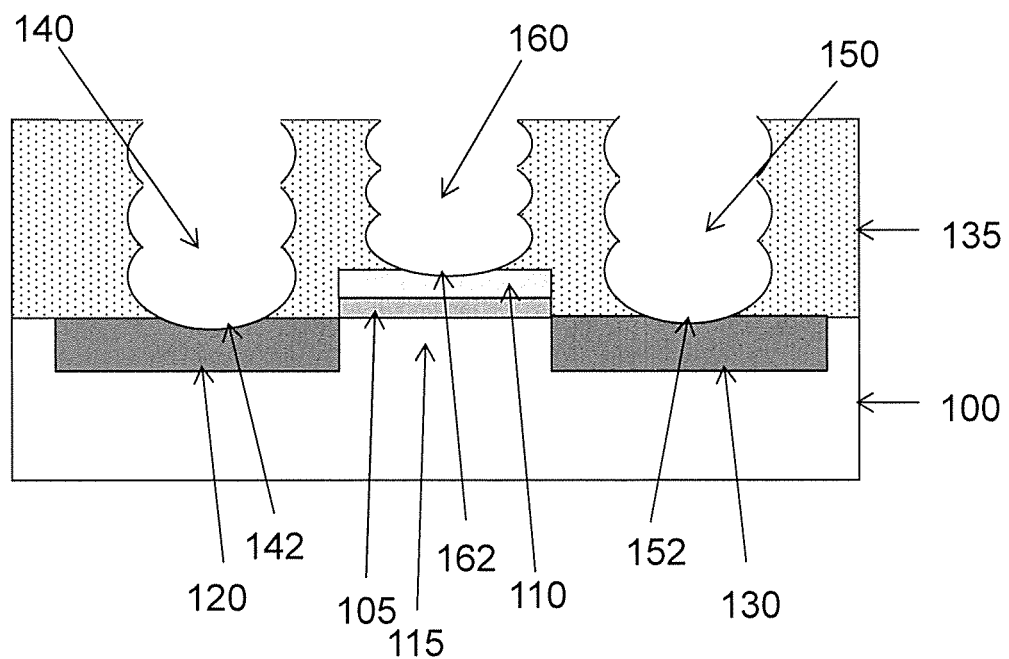
FIG. 16 illustrates a process step of a method for manufacturing a semiconductor device according to embodiments of the present disclosure.

Referring to FIG. 16, a thermal annealing process converts the first to third integral regions 140A, 150A, and 160A to the first to third vias 140, 150, and 160. The thermal annealing process can be rapid thermal annealing (RTA), microwave annealing (MWA), laser anneal, etc. In some embodiments, the annealing temperature can be from about 50° C. to about 1300° C. In other embodiments, the annealing temperature is from about 600° C. to about 800° C. The ramp rate can be about 0.1° C./s to about 1000° C./s in some embodiments. The ramp rate can be about 50° C./s to about 200° C./s in other embodiments. The duration of thermal annealing is from about 1 second to about 24 hours in some embodiments. The duration of thermal annealing is from about 1 minute to about 10 minutes in other embodiments. The present disclosure however, is not limited thereto. a thermal annealing process is performed. Accordingly, the first dimple 142 is formed in the source region 120 such that the source region 120 is partially exposed by the first via 140, the second dimple 152 is formed in the drain region 130 such that the drain region 130 is partially exposed by the second via 150, and the third dimple 162 is formed in the gate electrode region 110 such that the gate electrode 110 is partially exposed by the third via 160.

Descriptions of the process to form the first to third vias 140, 150, and 160, and the structure of the first to third vias 140, 150, and 160 can be referred to the above descriptions. Therefore, overlapped descriptions will be omitted to avoid redundancy.

According to some embodiments, a trimming process can be performed to reduce a degree of concave/convex on the sidewalls of the first to third vias 140, 150, and 160. According to some embodiments, the trimming process is a plasma treatment with $CH_xF_y$ (x=0 to 4, y=0 to 4, x+y=4) for about 1 second to about 1 hour or from 30 seconds to 2 minutes. In other embodiments, the trimming process includes dipping the structure in a buffered HF or BHF, in a case in which the insulating layer 135 is made of silicon oxide. Since an etching rate of the convex surfaces (or portions) protruding from the other portions is faster than that of the concave surfaces (or portions) in the buffered HF or BHF, the convex surfaces (or portions) are rounded by the trimming process.

Although FIGS. 13-16 illustrate that the second integral region 150A is formed after forming the first integral region 140A and before the third integral region 160A, the present disclosure is not limited thereto. According to some embodiments, the second integral region 150A or the third integral region 160A can be formed first. According to some embodiments, one or both of the second integral region 150A or the third integral region 160A can be formed before forming the first integral region 140A. The sequence of forming the first to third integral regions 140A, 150A, and 160A should not be limited thereto, and can be adjusted according to design particulars.

Although FIGS. 13-16 illustrate that each of the first to third vias 140, 150, and 160 is formed according to the above-described method to form a via in a substrate or in a layer by an ion beam such as a focused ion beam, the present disclosure is not limited thereto. In some embodiments, only one or only two among the first to third vias 140, 150, and 160 are made according to the above-described method to form a via in a substrate or in a layer by an ion beam such as a focused ion beam, and the remaining via/vias are made by other suitable methods.

Although FIGS. 10 and 13-16 illustrate that each of the first to third vias 140, 150, and 160 has one column of voids stacking on each other, the present disclosure should not be limited thereto. In other embodiments, each of the first to third vias 140, 150, and 160 can include two or more columns of voids connected to each other in the lateral direction. These features can be referred to the descriptions of FIG. 7 and will be omitted to avoid redundancy.

Figure 17:
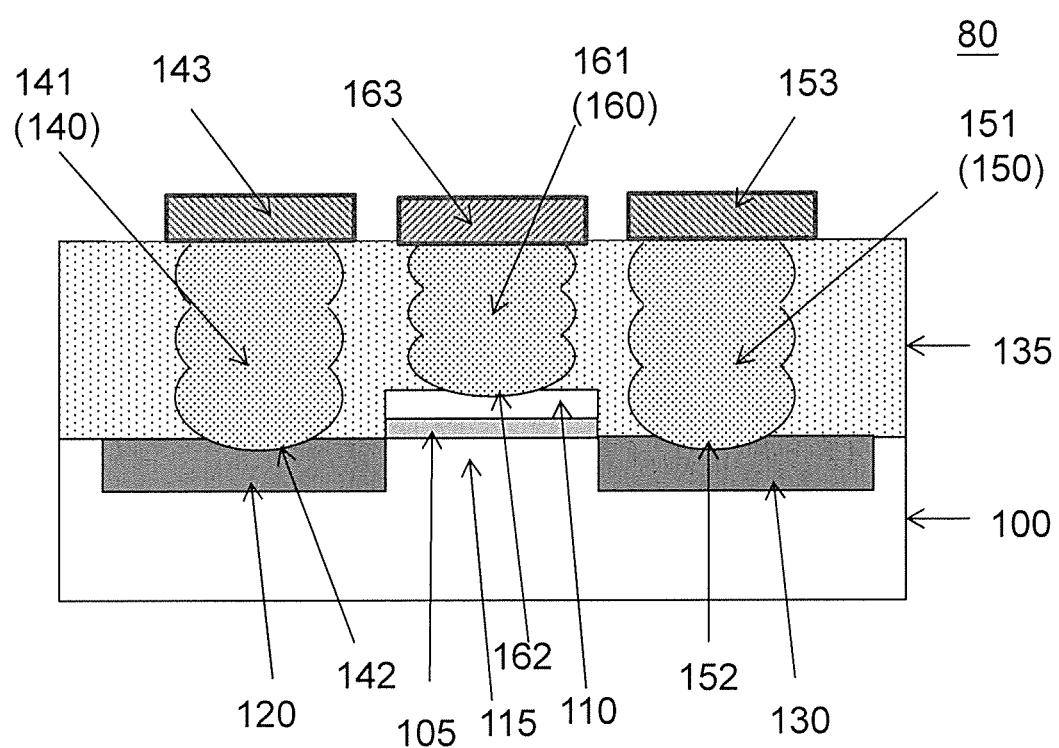
FIG. 17 illustrates a process step of a method for manufacturing a semiconductor device according to embodiments of the present disclosure.

Now referring to FIG. 17, the source contact 141, the drain contact 151, and the gate contact 161 are formed by filling one or more of the above-described electrically conductive material in the first to third vias 140, 150, and 160 and covering the insulating layer 135, followed by a patterning process, such that the source wiring 143, the drain wiring 153, and the gate wiring 163 are formed.

As described above, the first to third vias 140, 150, and 160 are separately formed according to some embodiments. That is, one of the first to third vias 140, 150, and 160 is after another of the first to third vias 140, 150, and 160. The present disclosure should not be limited thereto.

Figure 18:
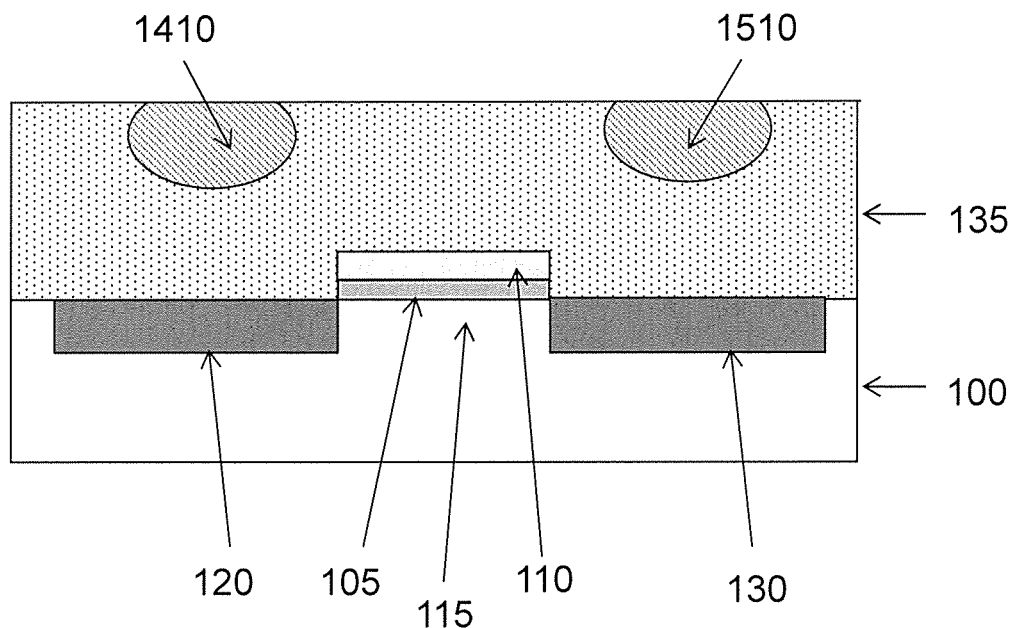
FIG. 18 illustrates a process step of a method for manufacturing a semiconductor device according to embodiments of the present disclosure.
Figure 19:
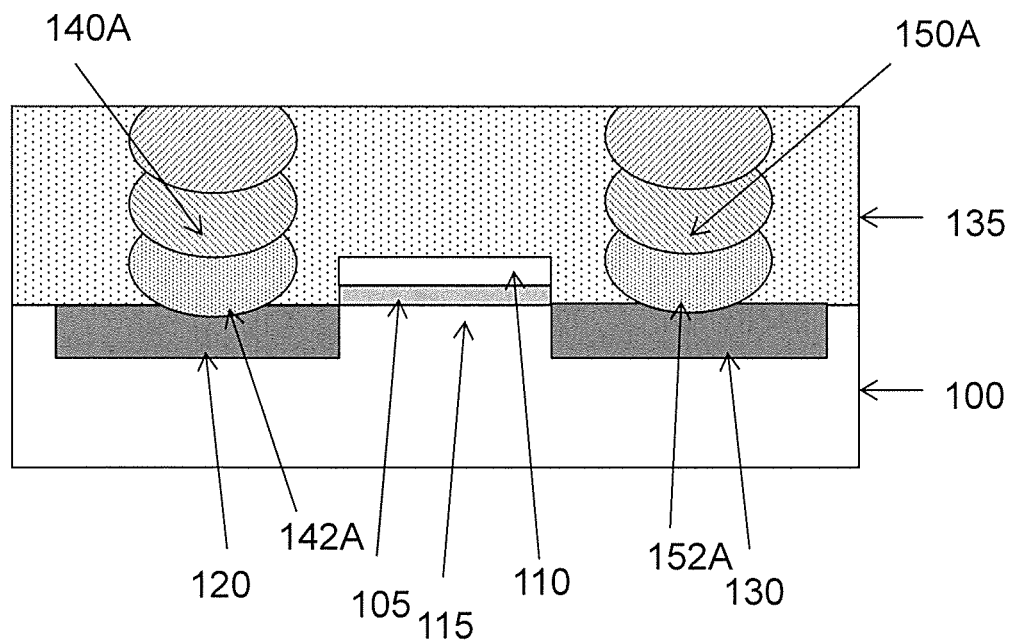
FIG. 19 illustrates a process step of a method for manufacturing a semiconductor device according to embodiments of the present disclosure.

FIGS. 18-19 illustrate process steps of a method for manufacturing the semiconductor device 80 shown in FIG. 10, according to embodiments of the present disclosure.

Referring to FIG. 18, a region 1410 corresponding to a portion of the first via 140 and a region 1510 corresponding to a portion of the second via 150 can be simultaneously bombarded by, for example, ion beams or focused ion beams, in a case in which two or more ion beams such as focused ion beams having the same or similar functionality are used to manufacture the semiconductor device 80. Similarly, additional regions below the regions 1410 and the region 1510 can also be simultaneously formed. As such, the first and second integral regions 140A and 150A shown in FIG. 19 can be simultaneously formed.

Figure 20:
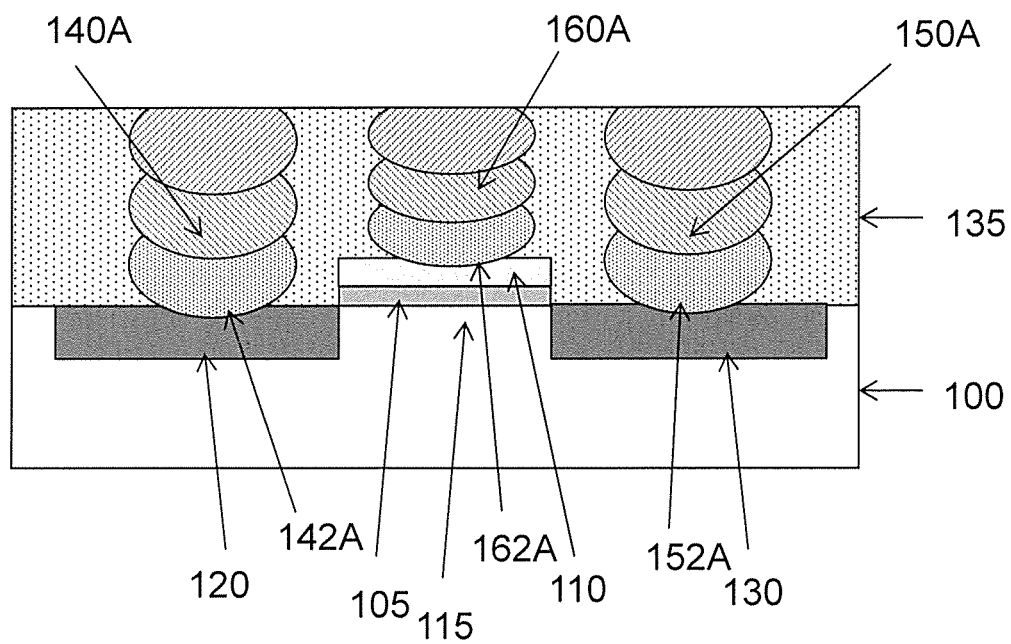
FIG. 20 illustrates a process step of a method for manufacturing a semiconductor device according to embodiments of the present disclosure.

Thereafter, the third integral region 160A having a depth less than that of the first and second integral regions 140A and 150A is formed, as shown in FIG. 20.

One of ordinary skill in the art should understand that the order of the process step shown in FIGS. 19 and 20 should not be limited to that described above and can be reversed according to other embodiments.

Other process steps such as forming the structure before forming the first to third vias 140, 150, and 160 and after forming the first to third vias 140, 150, and 160 can be referred to descriptions with reference to FIGS. 11, 12, 16, and 17, and thus will not be repeated here.

Figure 21:
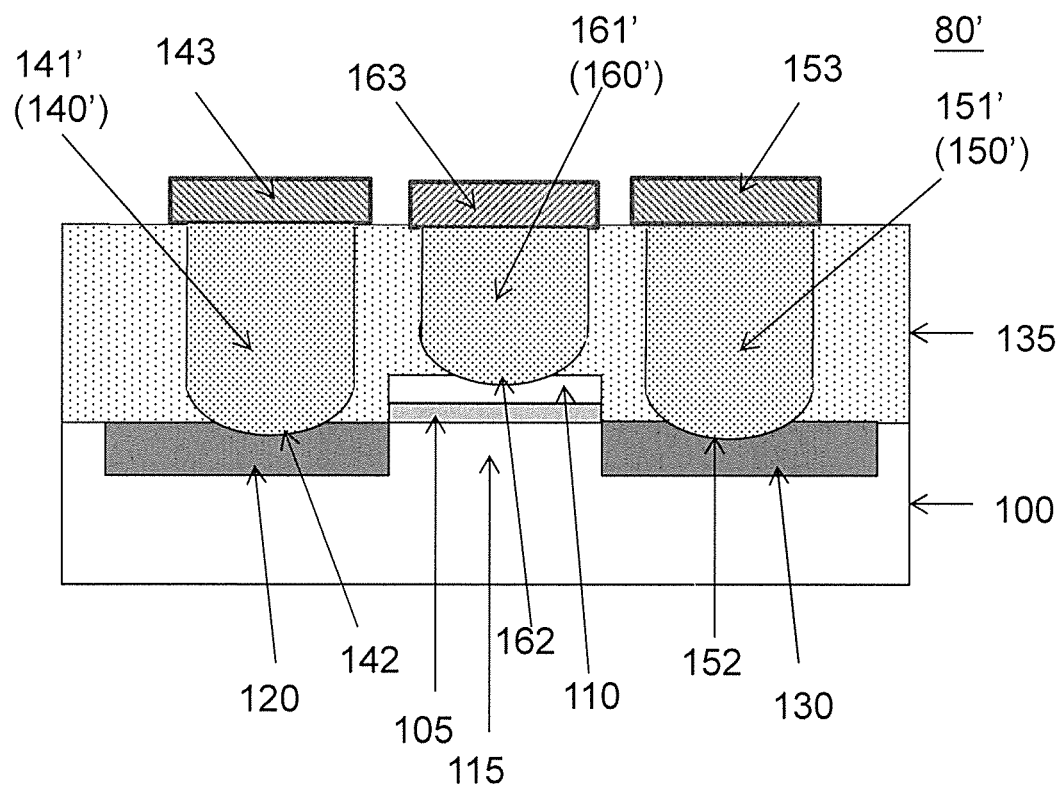
FIG. 21 shows a cross-sectional view of a semiconductor device according to some embodiments of the present disclosure.

FIG. 21 shows a cross-sectional view of another semiconductor device according to some embodiments of the present disclosure.

According to some embodiments, a semiconductor device 80' shown in FIG. 21 is substantially the same as that shown in FIG. 10, except that a drain contact 141' fills a via 140' having substantially straight sidewalls in the cross-sectional view, a source contact 151' fills a via 150' having substantially straight sidewalls in the cross-sectional view, and a gate contact 161' fills a via 160' having substantially straight sidewalls in the cross-sectional view.

One of ordinary skill in the art should understand that the manufacturing process of the semiconductor device 80' can be substantially the same as that described with references to FIGS. 11-17 or FIGS. 11, 12, 18-20, 16, and 17 except that a trimming process is more effectively performed to ensure the substantially straight sidewalls in the cross-sectional view as compared to the trimming process described with reference to FIG. 16. Descriptions of the other structural features of the semiconductor device 80', the material compositions of the semiconductor device 80', and the method for making the semiconductor device 80' will be omitted to avoid redundancy.

In the above descriptions, planner transistors and method for making the same are described, in which vias for forming contacts are manufactured by a method according to embodiments of the present disclosure. One of ordinary skill in the art should understand how to modify the above planner transistors and the method for forming the same to produce other types of semiconductor devices such as a fin field effect transistor (FinFET) or a gate-all-around FET.

In the above descriptions, vias manufactured by a method according to embodiments of the present disclosure are used to make contacts to electrically connect to the source/drain regions and the gate electrode, respectively. The present disclosure should not be limited thereto.

According to other embodiments, vias manufactured by a method according to embodiments of the present disclosure can be used to make contacts on a level above that described above. For example, in a case in which the aforementioned transistor is implemented in an integrated circuit which has a plurality of metal wiring layers and contacts connecting the plurality of metal wiring layers, vias manufactured by a method according to embodiments of the present disclosure can be used to make other contacts on other levels. Such features will be more apparent with reference to FIGS. 25-27 to be described below.

According to some embodiments, the method for forming a via is implemented to form shallow trench isolation (STI) to be described below with reference to FIGS. 22-24.

Figure 22:
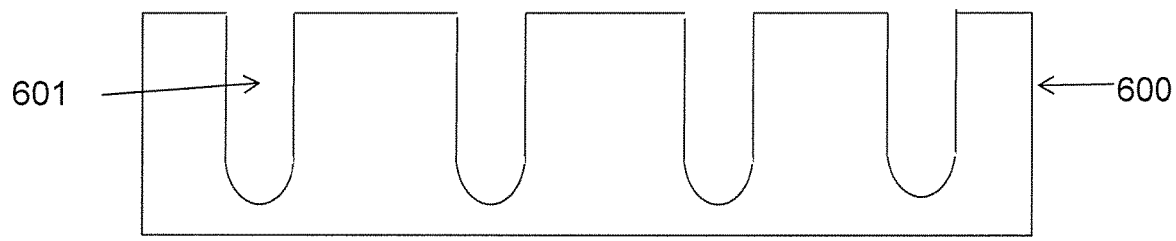
FIG. 22 illustrates a process step of a method for forming shallow trench isolation in a substrate according to embodiments of the present disclosure.

As shown in FIG. 22, a via 601 is formed in a semiconductor substrate 600 made of, for example, one of Si, Ge, SiGe, SiC, SP, SiPC, InP, InAs, GaAs, AnnAs, InGaP, InGaAs, GaAsSb, GaPN, and AlPN. The above-described method to form the via 45 in the substrate 10 shown by FIG. 6 can be used to form the via 601 in the semiconductor substrate 600. Overlapped descriptions will be omitted to avoid redundancy. The via 601 has a dimple at the bottom thereof, according to one embodiment.

Figure 23:
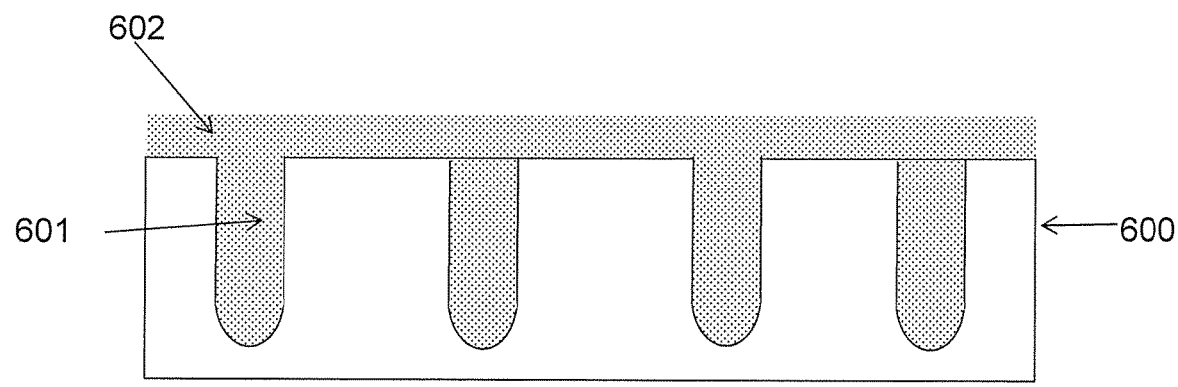
FIG. 23 illustrates a process step of a method for forming shallow trench isolation in a substrate according to embodiments of the present disclosure.

Thereafter, as shown in FIG. 23, a dielectric material 602 such as an insulating material including, but not limited to, silicon oxide, silicon nitride, SiON, SiOCN, or spin-on-glass (SOG), is deposited to fill the via 601 and cover an upper surface of the substrate 600.

Figure 24:
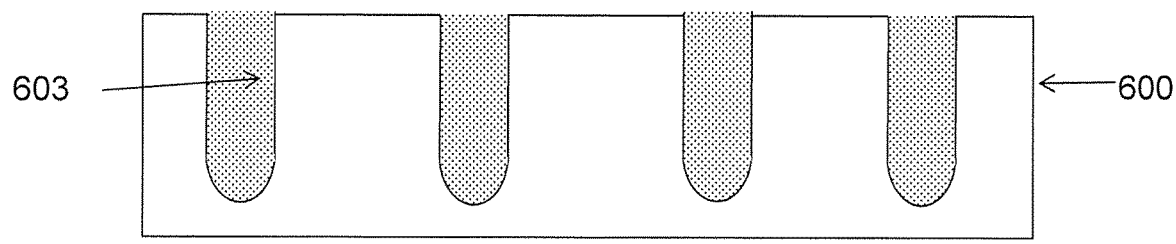
FIG. 24 illustrates a process step of a method for forming shallow trench isolation in a substrate according to embodiments of the present disclosure.

Next, as shown in FIG. 24, a planarization process, such as a chemical mechanical polishing (CMP), is performed to remove at least the dielectric material 602 over the upper surface of the substrate 600. Accordingly, STI 603 is formed in the substrate 600 suitable to manufacture semiconductor devices. A case in which the trimming process is not performed or insufficiently performed, the sidewalls of the STI 603 can have concave and convex portions alternating with each other, due to concave and convex portions of the sidewalls of the via similar to those of the sidewalls of the via 20 or 20' shown in FIG. 4B or FIG. 5. Overlapped descriptions will be omitted to avoid redundancy.

According to some embodiments, the method for forming a via is implemented to form backend of line (BEOL) via structures over an active region, in which semiconductor devices such as transistors are formed.

Figure 25:
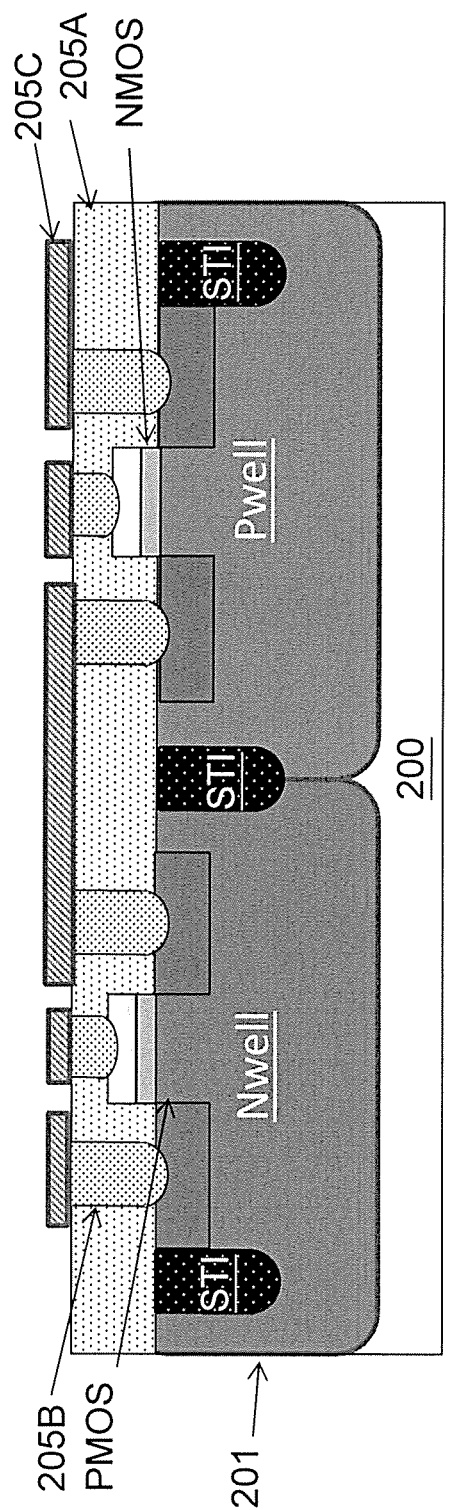
FIG. 25 illustrates a process step of a method for manufacturing a semiconductor device according to embodiments of the present disclosure.

Referring to FIG. 25, a semiconductor devices including one or more n-type field-effect transistors NMOS and one or more p-type filed-effect transistors PMOS are manufactured in an active region 201 including one or more n-type wells Nwell and one or more p-type wells Pwell in an upper portion of a semiconductor substrate 200. The semiconductor substrate 200 is made of, for example, one of Si, Ge, SiGe, SiC, SP, SiPC, InP, InAs, GaAs, AnnAs, InGaP, InGaAs, GaAsSb, GaPN, and AlPN. Before NMOS and PMOS transistors are formed, shallow trench isolation STI made of, for example, an insulating material, is formed between n-type wells Nwell and p-type wells Pwell adjacent to each other. In some embodiments, the STI is made by the above-method described with reference to FIGS. 22-24.

The above-described method to form the drain contact 141', the source contact 151', and the gate contact 161' as shown in FIG. 21 can be used to form respective drain contacts, source contacts, and gate contacts (denoted by reference character 205B) in a first interlayer dielectric layer 205A over the active region 201. The contacts 205B have a dimple at the bottom thereof, according to one embodiment. A first wiring layer 205C is then formed over the first interlayer dielectric layer 205A by a method similar to that to form the drain wring 143, the source wiring 153, and the gate wiring 163 as shown in FIGS. 10 and 21, such that the first wiring layer 205C is electrically connected to source/drain regions or gate electrodes of the NMOS and/or PMOS transistors through the contacts 205B. Overlapped descriptions will be omitted to avoid redundancy.

Figure 26:
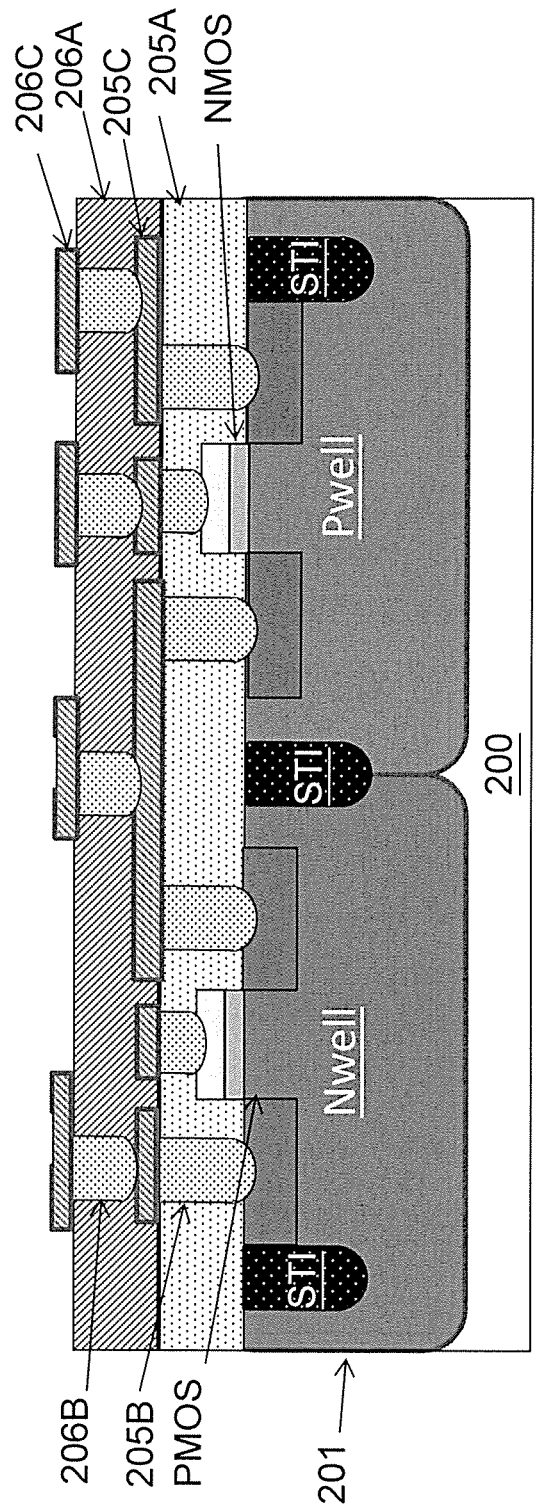
FIG. 26 illustrates a process step of a method for manufacturing a semiconductor device according to embodiments of the present disclosure.

Subsequently, as shown in FIG. 26, one or more upper level interlayer dielectric layers (denoted by reference character 206A) are formed over the first wiring layer 205C and the first interlayer dielectric layer 205A, contacts (denoted by reference character 206B) penetrating through the one or more upper level interlayer dielectric layers 206A are formed by the above-described method to form the contacts with reference to FIGS. 13-21, and one or more upper level wiring layers (denoted by reference character 206C) are formed over the one or more upper level interlayer dielectric layers 206A. The contacts 205B have a dimple at the bottom thereof, according to one embodiment. Overlapped descriptions will be omitted to avoid redundancy. The number of the upper level interlayer dielectric layers 206A, the contacts 206B penetrating therethrough, and the wirings 206C disposed thereon, are not limited to those shown in FIG. 26, and can be modified according to design particulars.

Figure 27:
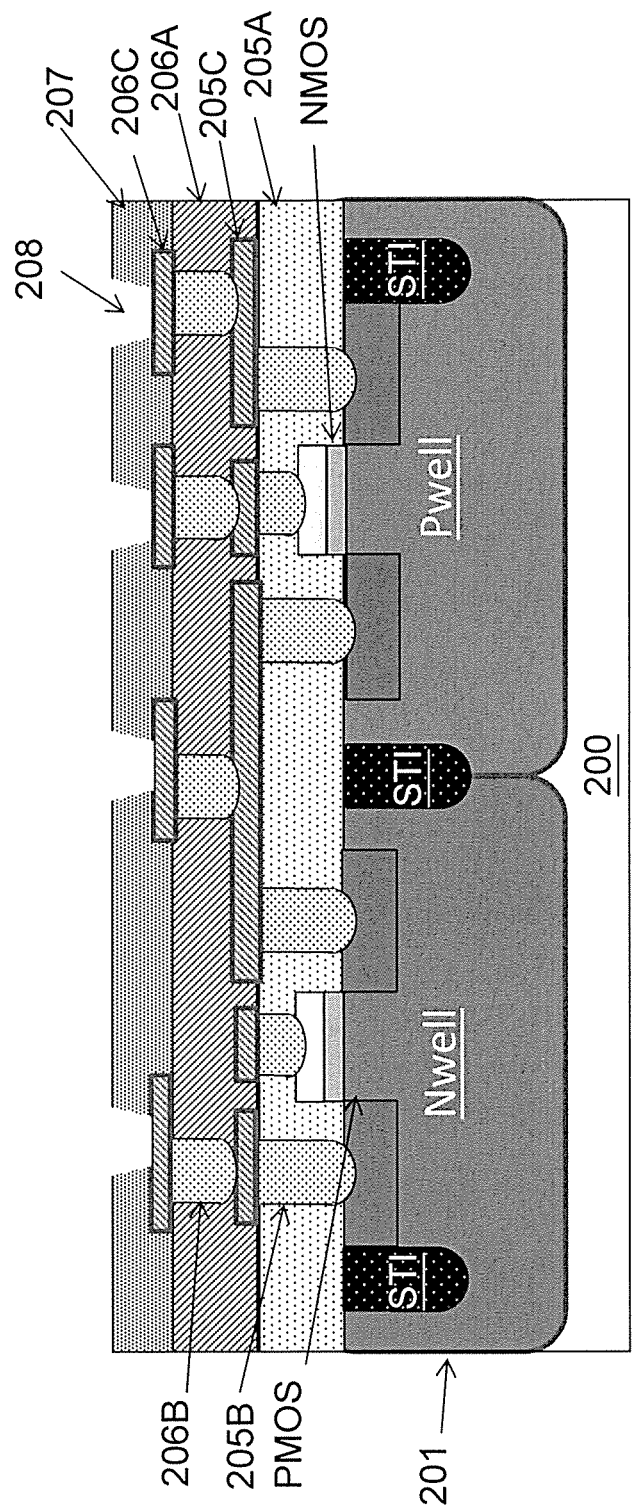
FIG. 27 illustrates a process step of a method for manufacturing a semiconductor device according to embodiments of the present disclosure.

Thereafter, as shown in FIG. 27, a passivation layer 207 is formed over the uppermost dielectric layer 206A to cover the uppermost wiring layer 206C disposed thereon. Openings 208 are then formed in the passivation layer 207 to expose portions of the uppermost wiring layer 206C for external connection through, for example, solder bumps, metal pillars, etc.

Although FIGS. 25-27 show that the sidewalls of the contacts 205B and 206B are flat, the sidewalls of the contacts 205B and 206B can have concave and convex structures alternating with each other, in a case in which the above-described trimming process after the bombarding is omitted or not performed sufficiently.

According to some embodiments, the method for forming a via is implemented to form through silicon via (TSV) of an interposer to package a semiconductor chip to be described below with reference to FIGS. 28-33.

Figure 28:
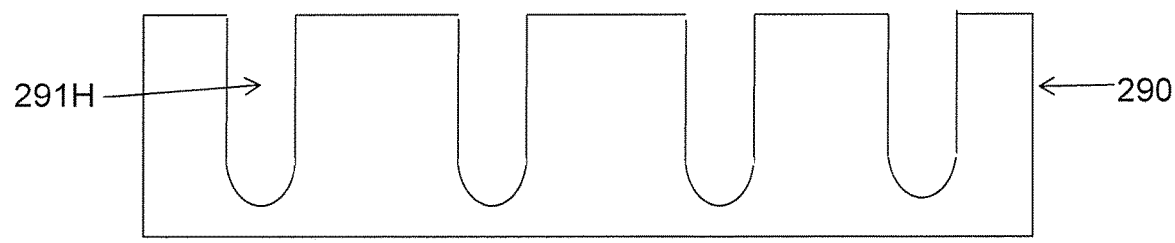
FIG. 28 illustrates a process step of a method for packaging a semiconductor chip according to embodiments of the present disclosure.

As shown in FIG. 28, vias 291H are formed in a silicon substrate 290 or in an insulating substrate. The above-described method to form the via 45 in the substrate 10 as shown in FIG. 6 can be used to form the vias 291H in the silicon substrate 290. Overlapped descriptions will be omitted to avoid redundancy. Although not shown, an insulating layer such as silicon oxide, silicon nitride, SiON, SiOCN, or spin-on-glass (SOG) is formed on walls of the vias 291H and on an upper surface and a lower surface of the silicon substrate 290.

Figure 29:
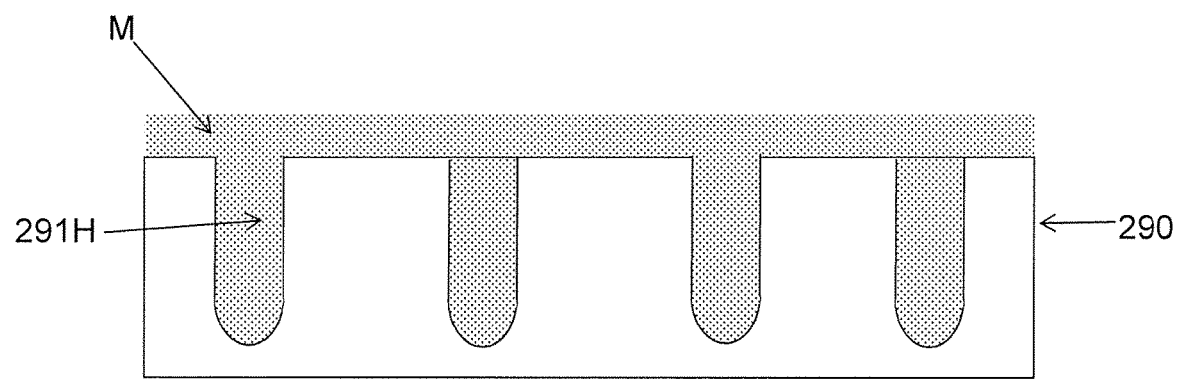
FIG. 29 illustrates a process step of a method for packaging a semiconductor chip according to embodiments of the present disclosure.

Referring to FIG. 29, a conductive material M such as metal including copper or the like fills the vias 291H and covers the upper surface of the silicon substrate 290. In some embodiments, the insulating layer formed on the inner wall of the vias 291H and on the upper surface and the lower surface of the silicon substrate 290 is performed by CVD or thermal oxidation, before the conductive material M is formed.

Figure 30:
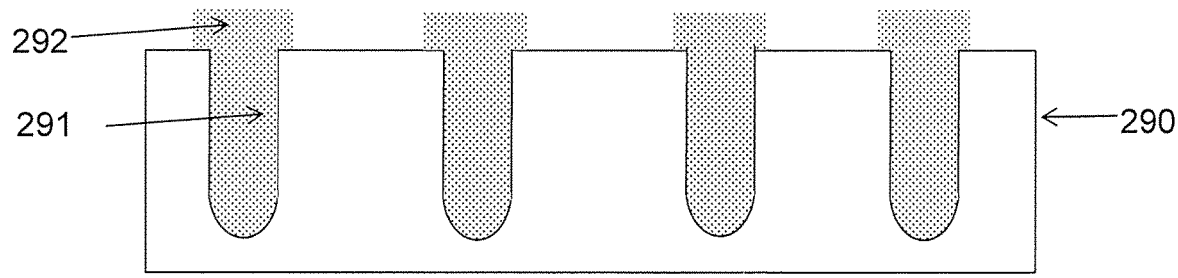
FIG. 30 illustrates a process step of a method for packaging a semiconductor chip according to embodiments of the present disclosure.

Thereafter, as shown in FIG. 30, the portions of the conductive material M on the upper surface of the silicon substrate 290 are patterned to form conductive patterns 292 acting as a redistribution layer connected to the conductive plugs 291.

Figure 31:
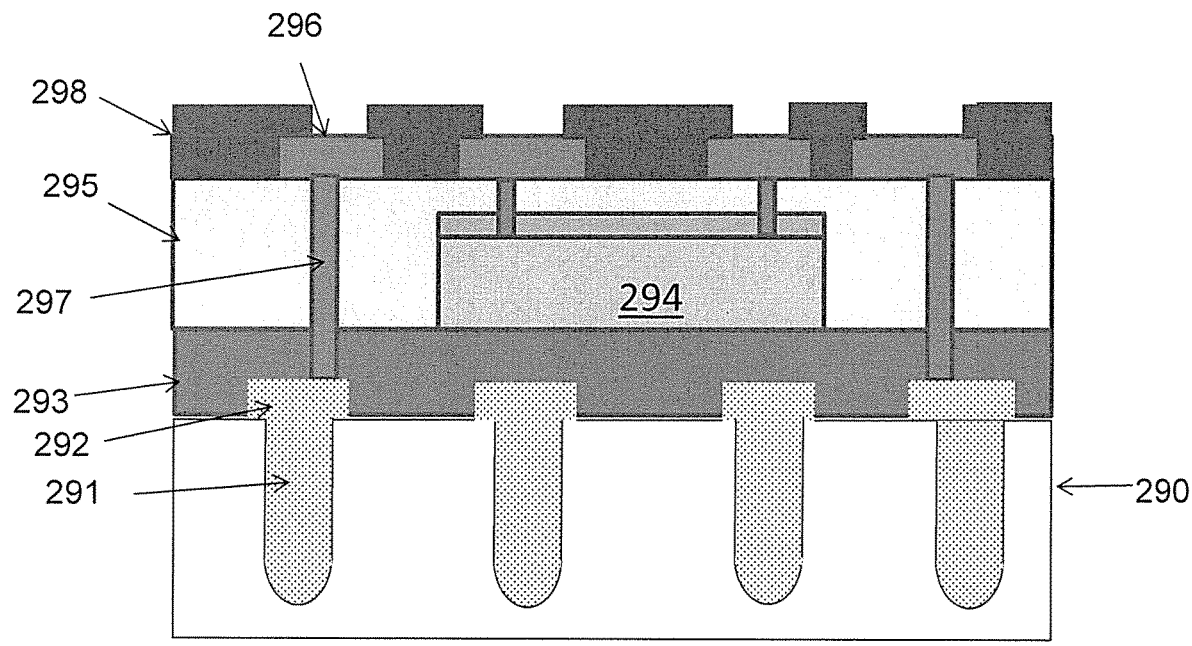
FIG. 31 illustrates a process step of a method for packaging a semiconductor chip according to embodiments of the present disclosure.

Next, as shown in FIG. 31, an insulating layer 293 is disposed to cover the conductive patterns 292. A semiconductor chip 294 is mounted on the insulating layer 293 and then encapsulated by a resin 295. Thereafter, openings are formed in the resin and the insulating layer 293, and a conductive material such as metal including copper or the like fills the openings and over the resin 295. After patterning the portions of the conductive material over the resin 295, the conductive material is converted to conductive patterns 296 acting as another redistribution layer connected to the conductive patterns 292 and to pads of the semiconductor chip 294 through the conductive plug 297. Thus, the pads of the semiconductor chip 294 are redistributed to the conductive plugs 291. A protective layer 298 is then formed to protect the conductive patterns 296. In some embodiments, portions of the conductive patterns 296 are exposed by the protective layer 298, such that the exposed portions of the conductive pattern 296 can be connected to an external device/package or a circuit board.

Figure 32:
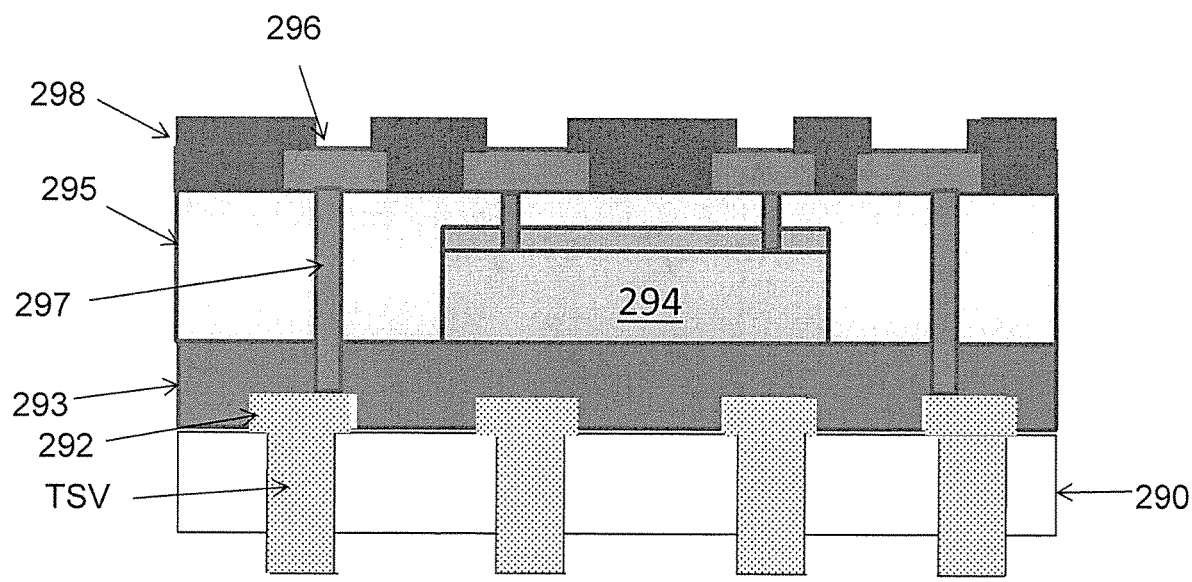
FIG. 32 illustrates a process step of a method for packaging a semiconductor chip according to embodiments of the present disclosure.

Now referring to FIG. 32, the bottom portion of the silicon substrate 290 is removed, for example, by CMP followed by a wet of dry etching of silicon. Thus, the lower portions of the conductive plugs 291 are exposed from the backside of the silicon substrate 290 and become through silicon vias (TSV). The silicon substrate 290 becomes an interposer having TSV to mount the semiconductor chip 290 to a circuit board or another package.

Figure 33:
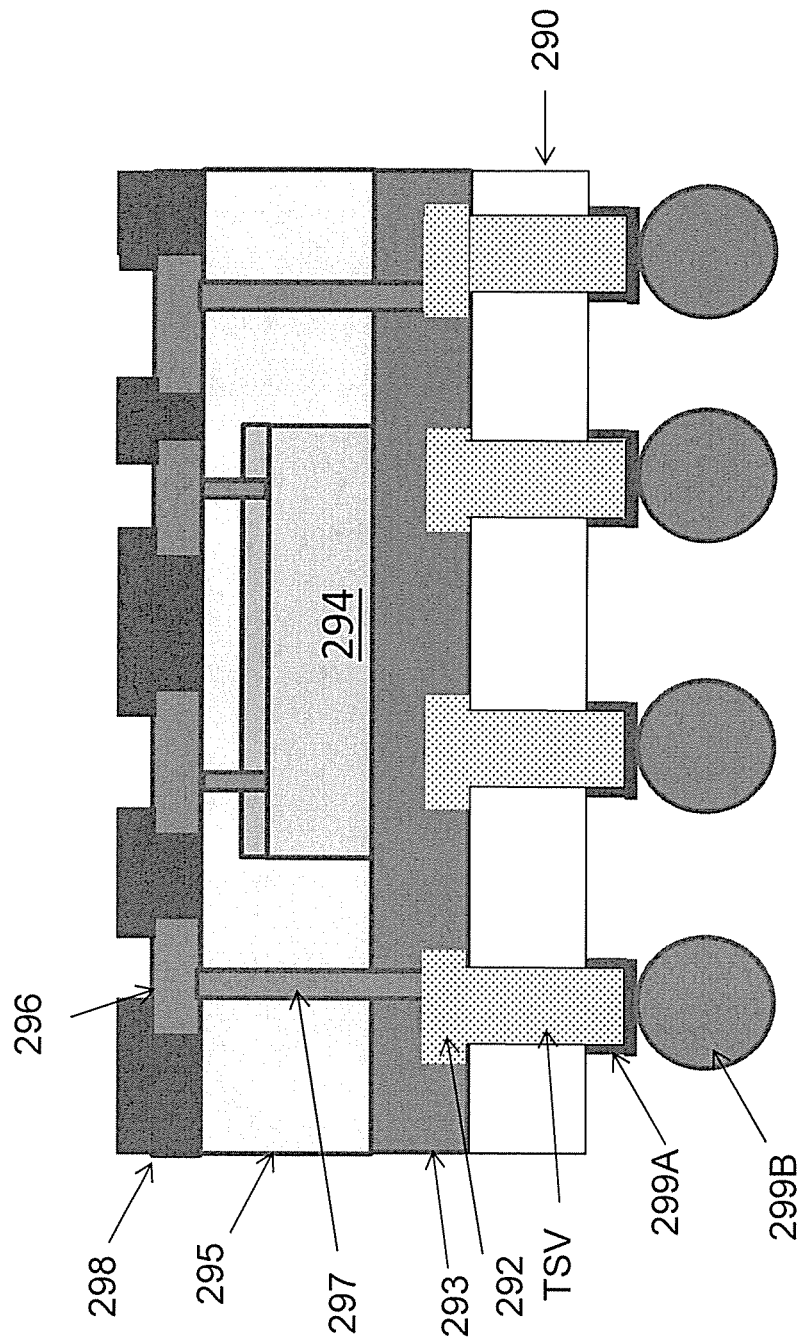
FIG. 33 illustrates a process step of a method for packaging a semiconductor chip according to embodiments of the present disclosure.

Next, as shown in FIG. 33, an under-metal-metallurgy (UBM) layer 299A and backside metal bumps 300 such as solder balls are formed on the backside of silicon substrate 290. Thus, a package packaging the semiconductor chip 294 can be connected to a circuit board or another package through the metal bumps 299B.

In a case in which the trimming process is not performed or insufficient performed, the sidewalls of the TSV can have concave and convex portions alternating with each other, due to concave and convex portions of the sidewalls of the vias, similar to those of the sidewalls of the via 20 or 20'. Overlapped descriptions will be omitted to avoid redundancy.

The material to form the interposer is not limited to silicon. Any other materials that allow vias to be formed therein by the method according to embodiments of the present disclosure can be used. For example, an insulating material, such as a glass substrate, is used to make the interposer.

In some embodiments, the TSVs are formed in the substrate of the semiconductor chip 294, rather than a separated interposer.

According to other embodiments, vias manufactured by a method according to embodiments of the present disclosure can be used to make through silicon vias (TSV) to electrically connect contacts/pads on different substrates. As such, the vias manufactured by a method according to embodiments of the present disclosure can be implemented to integrate multiple chips/dies/packages in a vertical direction.

According to some aspects, a via or a contact can be shrunk to sub 10-nanometer and have an aspect ratio of 1000 or greater.

According to some aspects, no photoresist pattern is used to form the via. Thus, a photolithography process can be avoided to make the via.

According to some aspects, a location of the via can be precisely controlled by an ion beam or a focused ion beam. Thus, the via can be formed directly by an ion beam or a focused ion beam with an extremely small beam size.

According to some aspects, the via can be formed in a multilayer structure including two or more layers made of different materials, without using different etching processes to etch the two or more layers.

In one embodiment, a method for manufacturing a semiconductor device includes forming a source region, a drain region, and a gate dielectric layer and a gate electrode covering a channel region between the source region and the drain region, forming an insulating layer over the source region, the drain region, and the gate electrode, forming first to third vias penetrating the insulating layer and exposing portions of the source region, the drain region, and the gate electrode, respectively, forming a source contact in the first via to electrically connect to the source region, forming a drain contact in the second via to electrically connect to the drain region, and forming a gate contact in the third via to electrically connect to the gate electrode. One or more of the first to third vias is formed by ion bombarding by a focused ion beam and followed by a thermal annealing process, thereby removing a part of the insulating layer. In one embodiment, a sidewall of the one or more of the first to third vias includes a plurality of convex and concave portions. In one embodiment, the ion bombarding by the focused ion beam is simultaneously performed in first and second regions where the first and second vias are formed, before or after ion bombarding by the focused ion beam performed in a third region where the third via is formed. In one embodiment, the ion bombarding by the focused ion beam performed in first to third regions where the first to third vias are formed is performed at different time periods. In one embodiment, the method further includes performing a trimming process before forming the source contact, the drain contact, and the gate contact, so as to reduce a degree of convex/concave on a sidewall of the one or more of the first to third vias. In one embodiment, the first via partially penetrates into the source region such that the source region has a dimple filled with a material for forming the source contact, the second via partially penetrates into the drain region such that the drain region has a dimple filled with a material for forming the drain contact, or the third via partially penetrates into the gate electrode such that the gate electrode has a dimple filled with a material for forming the gate contact. In one embodiment, the focused ion beam is one selected from the group consisting of a focused helium ion beam, a focused hydrogen ion beam, a focused neon ion beam, and a focused gallium ion beam. In one embodiment, the thermal annealing process is performed at a temperature from 600° C. to 800° C. In one embodiment, the one or more of the first to third vias partially penetrate into one or more of the source region, the drain region, and the gate electrode.

In one embodiment, a method for packaging a semiconductor chip includes forming vias in a substrate, forming conductive plugs in the vias and first conductive patterns over the substrate and electrically connected to the conductive plugs, forming an insulating layer over the first conductive patterns, mounting the semiconductor chip on the insulating layer, encapsulating the semiconductor chip by a resin, forming second conductive patterns over the resin to electrically connected to pads of the semiconductor chip and the first conductive patterns, performing a backside etching of the substrate to expose the conductive plugs, and forming backside metal bumps on the exposed conductive plugs. The vias are formed by ion bombarding by a focused ion beam and followed by a thermal annealing process, thereby removing a part of the substrate. In one embodiment, the ion bombarding by the focused ion beam is simultaneously performed in regions where the vias are formed. In one embodiment, the ion bombarding by the focused ion beam performed in regions where the vias are formed is performed at different time periods. In one embodiment, the method further includes performing a trimming process before forming the conductive plugs in the vias and the first conductive patterns. In one embodiment, the focused ion beam is one selected from the group consisting of a focused helium ion beam, a focused hydrogen ion beam, a focused neon ion beam, and a focused gallium ion beam. In one embodiment, thermal annealing process is performed at a temperature from 600° C. to 800° C.

In one embodiment, a method for forming shallow trench isolation (STI) includes forming a via in a substrate, depositing a dielectric material to fill the via and to cover an upper surfaced of the substrate, and performing a planarization process so as to remove the dielectric material over the substrate such that the remaining dielectric material in the via becomes the STI. The via is formed by ion bombarding by a focused ion beam and followed by a thermal annealing process, thereby removing a part of the substrate. In one embodiment, the method further includes performing a trimming process before depositing the dielectric material.

In one embodiment, the via has a curved bottom surface. In one embodiment, the focused ion beam is one selected from the group consisting of a focused helium ion beam, a focused hydrogen ion beam, a focused neon ion beam, and a focused gallium ion beam. In one embodiment, the thermal annealing process is performed at a temperature from 600° C. to 800° C.

The term "embodiment" or "embodiments" described above does not refer to the same embodiment or the same embodiments, and is provided to emphasize a particular feature or characteristic different from that of other embodiment or embodiments. One of ordinary skill in the art should understand that "embodiment" or "embodiments" described above can be considered to be able to be implemented by being combined in whole or in part with one another, unless an opposite or contradictory description is provided.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, the method comprising:

forming a source region, a drain region, and a gate dielectric layer and a gate electrode covering a channel region between the source region and the drain region;

forming an insulating layer over the source region, the drain region, and the gate electrode;

forming first, second, and third vias penetrating the insulating layer and exposing portions of the source region, the drain region, and the gate electrode, respectively;

forming a source contact in the first via to electrically connect to the source region;

forming a drain contact in the second via to electrically connect to the drain region; and forming a gate contact in the third via to electrically connect to the gate electrode, wherein a via of the first, second, and third vias is formed by two processes of ion bombarding and thermal annealing that comprise:

ion bombarding the insulating layer using a focused ion beam at two or more connected sections at two or more different depths in the insulating layer, and performing the thermal annealing after each ion bombarding of a section of the two or more connected sections to convert the section to a void, thereby the two or more connected sections are converted to two or more connected voids, wherein the ion bombarding comprises a first ion bombarding and a second ion bombarding, the thermal annealing comprises a first thermal annealing and a second thermal annealing, and the two or more connected sections comprise a first section and a second section, and wherein the first ion bombarding of the first section is followed by the first thermal annealing, the first thermal annealing is followed by the second ion bombarding of the second section, and the second ion bombarding is followed by the second annealing.

2. The method of claim 1, further comprising:
performing a trimming process before forming the source contact, the drain contact, and the gate contact, so as to reduce a degree of convex/concave on a sidewall of the one or more of the first, second, and third vias.

3. The method of claim 1, wherein the first via partially penetrates into the source region such that the source region has a dimple filled with a material for forming the source contact, the second via partially penetrates into the drain region such that the drain region has a dimple filled with a material for forming the drain contact, or the third via partially penetrates into the gate electrode such that the gate electrode has a dimple filled with a material for forming the gate contact.

4. The method of claim 1, wherein the thermal annealing is performed at a temperature from 600° C. to 800° C.

5. The method of claim 3, wherein the dimple in the source region has a greater depth than the dimple in the gate electrode.

6. The method of claim 1, wherein the first and second sections are at two different depths and are bombarded by two different ion beam energies.

7. The method of claim 1, wherein the first and second sections are at two different depths and are arranged over each other, and wherein the first and second sections at the two different depths are bombarded by two different ions of two different materials.

8. The method of claim 1, wherein the first section and the second section are at the two different depths and are arranged over each other with vertically aligned centers of the sections, and wherein the thermal annealing converts an amorphous material of sidewalls of the vias into a crystal structure.

9. The method of claim 1, wherein the two or more connected sections at the two or more depths are arranged over each other, and wherein at least two centers of the two or more connected sections are shifted with respect to each other.

10. A method for manufacturing a semiconductor device, the method comprising:
forming a source region, a drain region, and a gate electrode over a channel region between the source region and the drain region;
forming an insulating layer over the source region, the drain region, and the gate electrode;
forming vias by two processes consisting essentially of ion bombarding and thermal annealing, wherein the ion bombarding comprises bombarding portions of the insulating layer overlying each one of the source region, the drain region, and the gate electrode at two or more connected sections at two or more different depths with an ion beam to form two or more bombarded connected sections in the insulating layer overlying each one of the source region, the drain region, and the gate electrode, and
wherein the thermal annealing comprises annealing the insulating layer after each ion bombarding of a section of the two or more connected sections to convert the section to a void, thereby converting the two or more bombarded connected sections overlying each one of the source region, the drain region, and the gate electrode to the vias, thereby exposing portions of the source region, the drain region, and the gate electrode, respectively; and
filling the vias with an electrically conductive material, wherein the ion bombarding comprises a first ion bombarding and a second ion bombarding, the thermal annealing comprises a first thermal annealing and a second thermal annealing, and the two or more connected sections comprise a first section and a second section, and wherein in at least one of the source region, the drain region, and the gate electrode, the first ion bombarding of the first section is followed by the first thermal annealing of the insulating layer, the first thermal annealing is followed by the second ion bombarding of the second section, and the second ion bombarding is followed by the second annealing of the insulating layer.

11. The method of claim 10, wherein the thermal annealing is performed at a temperature from 600° C. to 800° C.

12. The method of claim 10, wherein a first via in the source region forms a first dimple in the source region and a second via in the gate electrode forms a second dimple in the gate electrode, and wherein the first dimple has a greater depth than the second dimple.

13. The method of claim 10, wherein the two or more connected sections at two or more depths in each one of the source region, the drain region, and the gate electrode are bombarded by two or more different ion beam energies.

14. The method of claim 10, wherein the two or more connected sections at two or more depths in each one of the source region, the drain region, and the gate electrode are bombarded by two or more different ions of two or more different materials.

15. The method of claim 10, wherein the first section and the second section are at the two different depths and are arranged over each other with vertically aligned centers of the sections, and wherein the thermal annealing converts an amorphous material of sidewalls of the vias into a crystal structure.

16. A method for manufacturing a semiconductor device, the method comprising:
forming a source region and a drain region in a substrate;
forming a gate electrode over the substrate between the source region and the drain region;
forming an insulating layer over the source region, the drain region, and the gate electrode;
forming vias by two processes consisting essentially of bombarding a plurality of connected sections at a plurality of different depths over each of the source region, drain region, and gate electrode in the insulating layer using an ion beam, and thermal annealing the insulating layer after each ion bombarding of a section of the plurality of connected sections to form the vias thereby exposing the source region, drain region, and gate electrode; and
filling the vias with an electrically conductive material, wherein the ion bombarding comprises a first ion bombarding and a second ion bombarding, the thermal annealing comprises a first thermal annealing and a second thermal annealing, and the plurality of connected sections comprise a first section and a second section, and wherein the first ion bombarding of the first section is followed by the first thermal annealing, the first thermal annealing is followed by the second ion bombarding of the second section, and the second ion bombarding is followed by the second annealing.

17. The method of claim 16, further comprising trimming walls of the vias before filling the vias with the electrically conductive material.

18. The method of claim 16, wherein the first and second sections are at different depths in each one of the source region, the drain region, and the gate electrode and are bombarded by different ion beam energies.

19. The method of claim 16, wherein the first and second sections are at different depths in each one of the source region, the drain region, and the gate electrode and are bombarded by ions of different materials, by different ion beam sizes, or by different ion beam currents.

20. The method of claim 16, wherein the first and second sections are at the different depths and are arranged over each other with vertically aligned centers of the sections, and wherein the thermal annealing converts an amorphous material of sidewalls of the vias into a crystal structure.

\* \* \* \* \*